(12) United States Patent
Kobayashi

(10) Patent No.: US 7,697,355 B2
(45) Date of Patent: Apr. 13, 2010

(54) SEMICONDUCTOR MEMORY AND SYSTEM WITH MATCHING CHARACTERISTICS OF SIGNAL SUPPLIED TO A DUMMY SIGNAL LINE AND A REAL SIGNAL LINE

(75) Inventor: Hiroyuki Kobayashi, Kawaski (JP)

(73) Assignee: Fujitsu Microelectronics Limited, Tokyo (JP)

( * ) Notice: Subject to any disclaimer, the term of this patent is extended or adjusted under 35 U.S.C. 154(b) by 208 days.

(21) Appl. No.: 11/890,477

(22) Filed: Aug. 7, 2007

(65) Prior Publication Data
US 2008/0043780 A1 Feb. 21, 2008

(30) Foreign Application Priority Data
Aug. 17, 2006 (JP) .............................. 2006-222548

(51) Int. Cl.
G11C 29/00 (2006.01)
(52) U.S. Cl. ............... 365/201; 365/210.1; 365/210.11; 365/210.12; 365/210.13; 365/210.14; 365/210.15; 365/200; 365/185.09; 365/185.2
(58) Field of Classification Search ............. 365/210.1, 365/210.11, 210.12, 210.13, 210.14, 210.15, 365/200, 201, 185.09, 185.2
See application file for complete search history.

(56) References Cited

U.S. PATENT DOCUMENTS

| | | | |
|---|---|---|---|
| 5,022,006 A * | 6/1991 | Fifield et al. ................ | 365/200 |
| 5,299,161 A | 3/1994 | Choi et al. | |
| 5,777,931 A * | 7/1998 | Kwon et al. ................ | 365/200 |
| 6,288,962 B1 * | 9/2001 | Nagaoka ................ | 365/210.12 |
| 6,556,472 B2 * | 4/2003 | Yokozeki ................ | 365/154 |
| 6,717,842 B2 * | 4/2004 | Watanabe et al. ........... | 365/154 |
| 6,804,153 B2 * | 10/2004 | Yoshizawa et al. ...... | 365/189.15 |
| 2002/0021592 A1 * | 2/2002 | Nakaoka ................ | 365/200 |
| 2004/0088612 A1 | 5/2004 | Seong | |

FOREIGN PATENT DOCUMENTS

| | | |
|---|---|---|
| JP | 5-144294 A | 6/1993 |
| JP | 2005-332446 A | 12/2005 |
| JP | 2006-059481 A | 3/2006 |
| KR | 2002-0013369 A | 2/2002 |

OTHER PUBLICATIONS

The European Search Report, issued on Jan. 29, 2008, for corresponding European Application No. 07113117.

* cited by examiner

*Primary Examiner*—VanThu Nguyen
*Assistant Examiner*—Eric Wendler
(74) *Attorney, Agent, or Firm*—Arent Fox LLP

(57) ABSTRACT

To fully evaluate a real signal line and a real memory cell adjacent to a dummy signal line and utilize dummy signal line as real signal line, a semiconductor memory includes at least one real signal line connected to real memory cells driven by a real driver and at least one dummy signal line outside the real signal line connected to dummy memory cells, driven by a dummy driver. Real driver and dummy driver drive the real signal line and the dummy signal line synchronous with a common timing signal generated by an operation control circuit. Consequently, a stress evaluation is also performable, e.g., on a real signal line outside of a memory cell array under the same condition of a real signal line on the inner side. Dummy signal line is driven using common timing signal and evaluated, thus being usable as a redundancy signal line to relieve failure.

17 Claims, 28 Drawing Sheets

SEMICONDUCTOR MEMORY AND SYSTEM WITH MATCHING CHARACTERISTICS OF SIGNAL SUPPLIED TO A DUMMY SIGNAL LINE AND A REAL SIGNAL LINE

CROSS REFERENCE TO RELATED APPLICATION

This application is based upon and claims the benefit of priority from Japanese Patent Application No. 2006-222548, filed on Aug. 17, 2006, the entire contents of which are incorporated herein by reference.

BACKGROUND

1. Field

The present invention relates to a semiconductor memory including a dummy circuit of dummy memory cells and so on.

2. Description of the Related Art

In a memory cell array of a semiconductor memory, elements and wirings are formed with higher density, compared to peripheral circuits. Therefore, in a manufacturing process of the semiconductor memory, the shapes of the elements and wirings in an inner portion of the memory cell array sometimes differ from those in an outer peripheral portion due to the influence of halation or the like. The difference in shape may cause a short failure and a disconnection failure, which becomes a factor behind a reduction in yield.

Conventionally, in order to make the shapes of the elements and wirings in the inner portion of the memory cell array equal to those in the outer peripheral portion and increase the yield, dummy memory cells and a dummy signal line (such as a dummy word line) are formed in the outer peripheral portion of the memory cell array (for example, Japanese Unexamined Patent Application Publication No. 2005-332446, Japanese Unexamined Patent Application Publication No. Hei 5-144294, and Japanese Unexamined Patent Application Publication No. 2006-59481). Further, a dummy driver to drive the dummy signal line is formed.

The dummy driver drives the dummy signal line, for example, in synchronization with a timing signal supplied to an external terminal. Alternatively, the dummy driver drives the dummy signal line at a timing different from a timing signal supplied to a real driver to drive a real signal line.

The conventional dummy driver drives the dummy signal line at a timing different from that of the real driver, and hence the driving timing of the dummy signal line is different from that of the real signal line. This causes a problem that a test on a real signal line adjacent to the dummy signal line cannot be fully performed. More specifically, for example, in the real signal line adjacent to the dummy signal line, the influence of a coupling capacitance between the adjacent signal lines cannot be fully evaluated. Moreover, as described above, since the driving timing of the dummy signal line is different from that of the real signal line, so that the dummy signal line cannot be used as the real signal line.

SUMMARY

An object of the present invention is to fully evaluate a real signal line and a real memory cell adjacent to a dummy signal line by matching characteristics of signals supplied to the dummy signal line and the real signal line.

Another object of the present invention is to make a dummy signal line usable as a real signal line by matching characteristics of timing signals supplied to the dummy signal line and the real signal line.

In one aspect of the present invention, a semiconductor memory includes at least one real signal line connected to real memory cells and driven by a real driver and at least one dummy signal line placed outside the real signal line and connected to dummy memory cells and driven by a dummy driver. The real driver and the dummy driver drive the real signal line and the dummy signal line in synchronization with a common timing signal generated by an operation control circuit. For example, the dummy driver operates to drive the dummy signal line during a test mode. A test mode setting circuit shifts an operation mode from a normal operation mode to the test mode in response to a first external signal outputted from a controller. The controller includes a test control circuit outputting the first external signal. By driving the real signal line and the dummy signal line using the common timing signal, the real signal line and the real memory cell adjacent to the dummy signal line can be fully evaluated. Consequently, a stress evaluation can be also performed, for example, on a real signal line located in an outer peripheral portion of a memory cell array under a same condition as a real signal line located on an inner side thereof. The dummy signal line is driven using the common timing signal and evaluated. Therefore, the dummy signal line can be used as the real signal line. Namely, the dummy signal line can be used a redundancy signal line to relieve a failure.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DETAILED DESCRIPTION OF THE EMBODIMENTS

Figure 1:
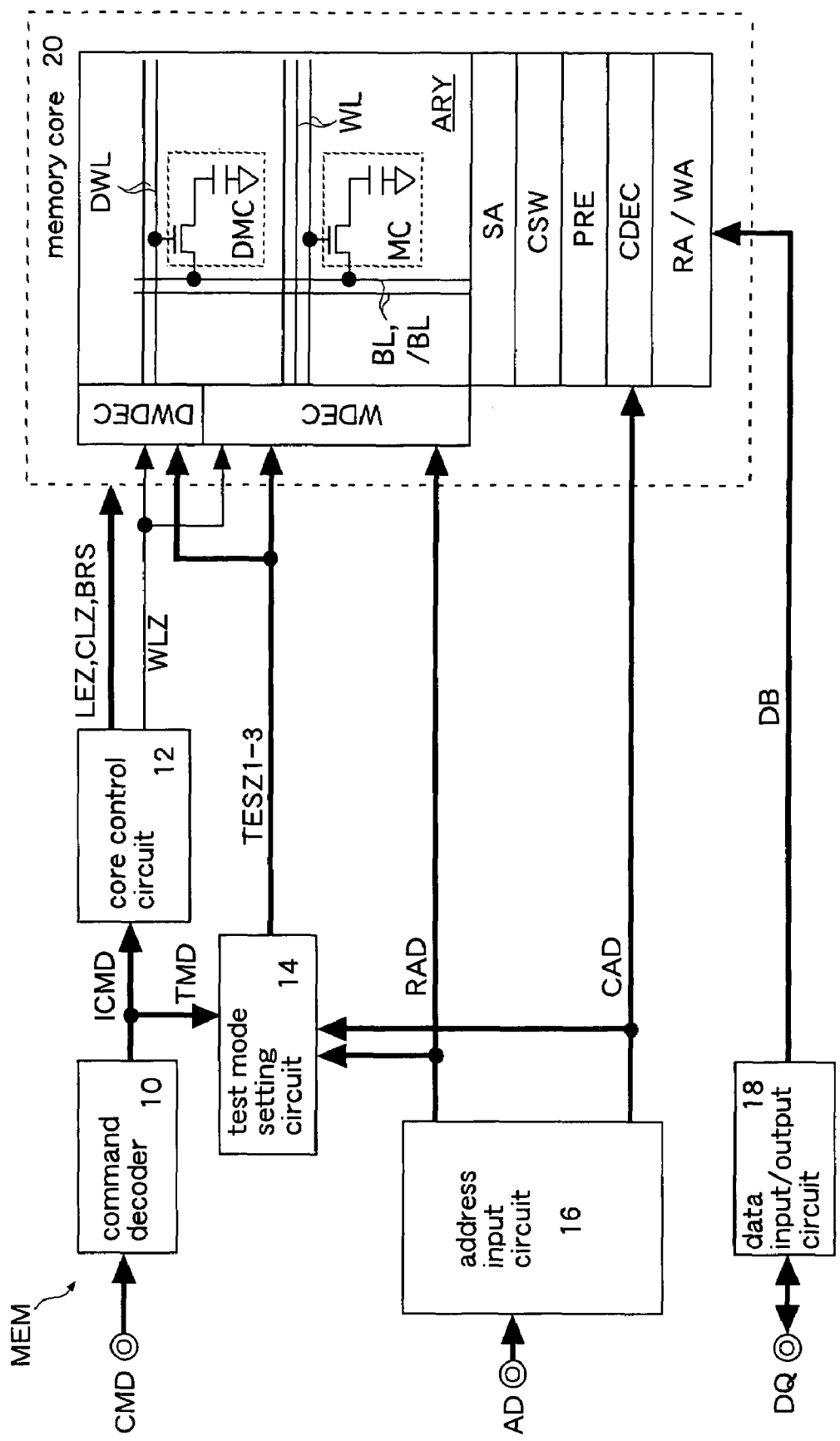
FIG. 1 is a block diagram showing a first embodiment of the present invention.

Hereinafter, embodiments of the present invention will be described, using the drawings. In the drawings, each signal line shown by the heavy line is constituted of a plurality of lines. Further, part of blocks to which the heavy lines are connected is constituted of a plurality of circuits. Each signal line through which the signal is transmitted is denoted by the same reference symbol as the signal name. Each signal starting with "/" represents negative logic. Each signal ending with "Z" represents positive logic. Each double circle in the drawings represents an external terminal.

FIG. 1 shows a first embodiment of the present invention. A semiconductor memory MEM is, for example, an FCRAM (Fast Cycle RAM). The FCRAM is a pseudo SRAM including DRAM memory cells and including an SRAM interface. The memory MEM includes a command decoder 10, a core control circuit 12, a test mode setting circuit 14, an address input circuit 16, a data input/output circuit 18, and a memory core 20. Further, to automatically perform a refresh operation of a memory cell MC, the semiconductor memory MEM includes a refresh timer to generate an internal refresh request, a refresh address counter to generate a refresh address, and so on (not shown). Since the present invention does not relate to control of the refresh operation, circuits and operations related to the refresh operation will not be described.

The command decoder 10 outputs an internal command signal ICMD (read command, write command), a test mode command TMD, and so on in response to a command signal CMD (for example, a chip enable signal /CE1, a write enable signal /WE, an output enable signal /OE, or the like). The read command and write command are access commands (access requests) to allow the memory core 20 to perform a read access operation and a write access operation. The test mode command TMD is a command to set the state of the test mode setting circuit 14 to test the memory core 20.

In response to the access request (read command, write command, or internal refresh request), the core control circuit 12 outputs a word line activation signal WLZ, a sense amplifier activation signal LEZ, a column control signal CLZ, and a precharge control signal BRS to allow the memory core 28 to perform a read operation, a write operation, or a refresh operation. The precharge control signal BRS, the word line activation signal WLZ, the sense amplifier activation signal LEZ, and the column control signal CLZ are sequentially generated based on a basic timing signal generated in the core control circuit 12 in synchronization with the access request.

The word line activation signal WLZ is a timing signal to control an activation timing of a word line WL. The sense amplifier activation signal LEZ is a timing signal to control an activation timing of a sense amplifier SA. The column control signal CLZ is a timing signal to control an on-timing of a column switch CSW. The precharge control signal BRS is a timing signal to control on/off of a precharge circuit PRE.

The test mode setting circuit 14 shifts the operation mode of the memory MEM from a normal operation mode to a test mode in response to the test mode command TMD (CMD; first external signal), and activates any of test control signals TESZ1-3 in response to an address AD (RAD, CAD; second external signal) supplied with the test mode command TMD. By activating the test control signal TESZ1-3 in response to the address AD supplied with the test mode command TMD, a case where the number of test types is increased can also be easily coped with out a command sequence being changed. For example, when the column address CAD is constituted of eight bits and the column addresses CAD of "01", "02", "03" in hexadecimal are supplied with the test mode command TMD, the test mode setting circuit 14 activates the test control signals TESZ1-3, respectively, and shifts the operation mode from the test mode to the normal operation mode when the column address CAD of "FF" in hexadecimal is supplied. Incidentally, if a mode register to set an operating specification of the memory MEM is formed in the memory MEM, the test mode setting circuit 14 may be formed in the mode register.

The address input circuit 16 receives the address AD and outputs the received address AD as the row address RAD and the column address CAD. The row address RAD is used to select the word line WL. The column address CAD is used to select bit lines BL, /BL. The data input/output circuit 16 receives write data via a data terminal DQ and outputs the received data to a data bus DB. Further, the data input/output circuit 16 receives read data from the memory cell MC via the data bus DB and outputs the received data to the data terminal DQ.

The memory core 20 includes a memory cell array ARY, a real word decoder WDEC, a dummy word decoder DWDEC, the sense amplifier SA, the column switch CSW, the precharge circuit PRE, a column decoder CDEC, a read amplifier RA, and a write amplifier WA. The memory cell array ARY includes plural real memory cells MC and dummy memory cells DMC, real word lines WL connected to the real memory cells MC arranged in a lateral direction of the figure, dummy word lines DWL connected to the dummy memory cells DMC arranged in the lateral direction of the figure, and bit lines BL, /BL connected to the memory cells MC, DMC arranged in a longitudinal direction of the figure. The memory cells MD, DMC are formed into the same shape and have the same characteristic as each other. Each of the memory cells MC, DMC includes a capacitor to hold data as an electric charge and a transfer transistor to connect one end of this capacitor to the bit line BL (or /BL). The other end of the capacitor is connected to a precharge voltage line VPR (FIG. 5), a cell plate line VCP not shown, and so on. A gate of the transfer transistor is connected to the word line WL (or DWL). Any of the read operation, the write operation, and the refresh operation is performed by the selection of the word line WL.

The real word decoder WDEC decodes the row address RAD to select any of the word lines WL during the normal operation mode. The real word decoder WDEC activates at least any of the word lines WL in response to the test control signal TESZ1-3 during the test mode. The dummy word decoder WDEC is inactivated and does not operate during the normal operation mode. The dummy word decoder WDEC activates at least any of the dummy word lines DWL in response to the test control signal TESZ1-3. The word line WL and the dummy word line DWL are activated at the same timing in synchronization with the common word line activation signal WLZ during the test mode.

The sense amplifier SA amplifies a difference in signal amount between data signals read to the bit line pair BL, /BL. The column switch CSW is selectively turned on according to the column address CAD, and connects the bit lines BL, /BL corresponding to the column address CAD to the read amplifier RA and the write amplifier WA. The precharge circuit PRE supplies a precharge voltage VPR to the bit lines BL, /BL during inactivation of the word lines WL and the sense amplifier SA. The column decoder CDEC decodes the column address CAD to select the bit line pair BL, /BL to/from which data DQ is inputted/outputted. The read amplifier RA amplifies complementary read data outputted via the column switch CSW in the read access operation. The write amplifier WA amplifies complementary write data supplied via the data bus DB and supplies it to the bit line pair BL, /BL in the write access operation.

Figure 2:
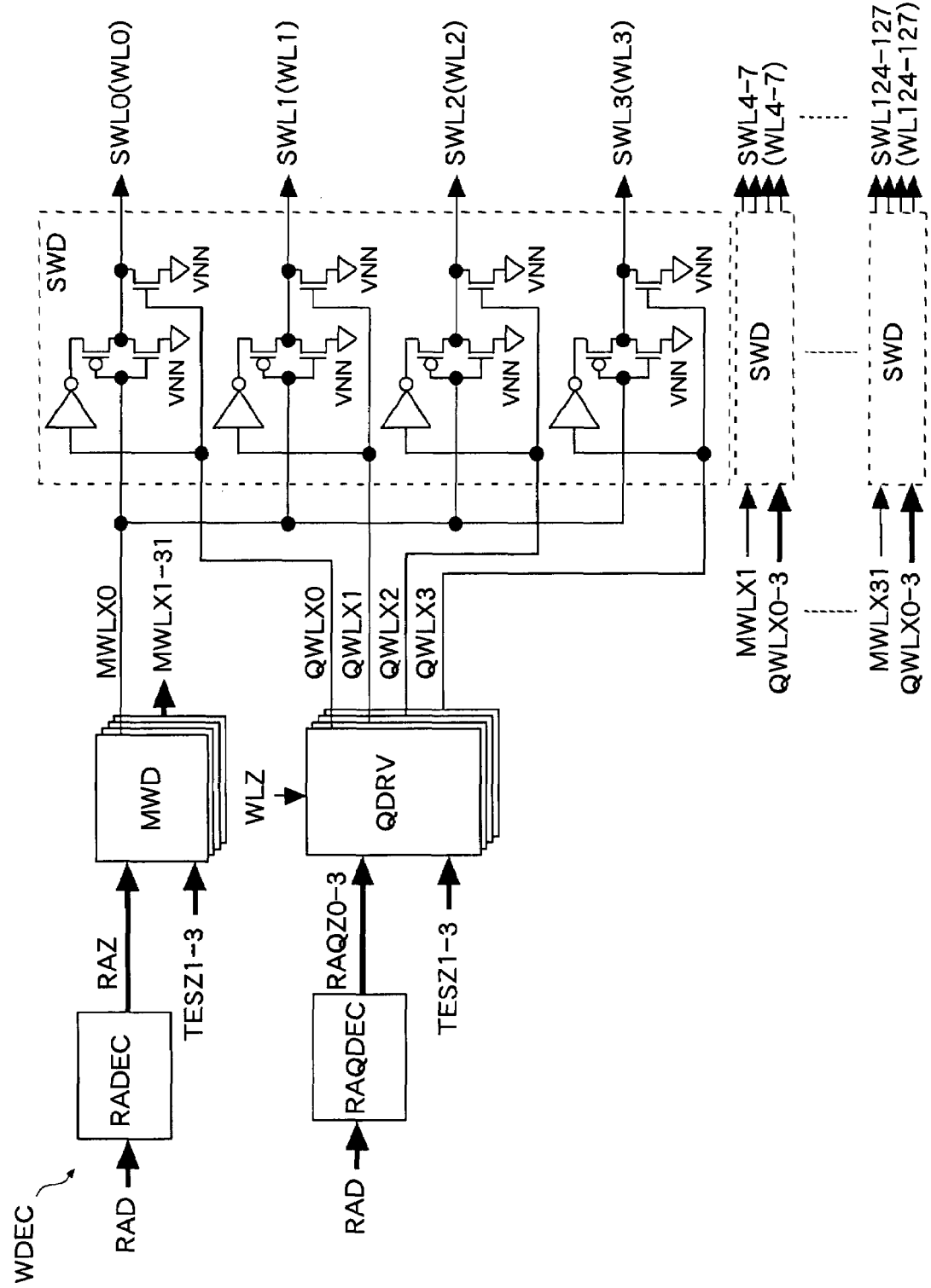
FIG. 2 is a block diagram showing details of a real word decoder shown in FIG. 1.

FIG. 2 shows details of the real word decoder WDEC shown in FIG. 1. The word decoder WDEC includes a predecoder RADEC, real main word decoders MWD, a quarter decoder RAQDEC, real quarter drivers QRDV, and real sub-word decoders SWD.

To activate a real main word line MWLX (any of MWLX0-31), the predecoder RADEC activates a decode signal RAZ corresponding to the value of higher-order bits of the row address RAD. The main word decoders MWD activate any of the main word lines MWLX0-31 to a low logic level in response to the decode signal RAZ during the normal operation mode. The main word decoders MWD activate the real main word lines MWLX0-31 in response to the test control signal TESZ1-3 regardless of the value of the decode signal RAZ. The main word decoders MWD recognize the normal operation mode when all the test control signals TESZ1-3 are at a low logic level and recognize the test mode when any of the test control signals TESZ1-3 is at a high logic level.

To select a sub-word line SWL (word line WL), the quarter decoder RAQDEC activates a decode signal RAQZ (any of RAQZ0-3) corresponding to the value of lower two bits of the row address RAD.

The quarter drivers QDRV activate a real sub-word activation signal QWLX0-3 corresponding to the activated decode signal RAQZ0-3 to a low logic level in synchronization with the word line activation signal WLZ during the normal operation mode. The quarter drivers QDRV activate the real sub-word activation signals QWLX0-3 in response to the test control signal TESZ1-3 regardless of the value of the decode signal RAQZ0-3. The quarter drivers QDRV recognize the normal operation mode when all the test control signals TESZ1-3 are at the low logic level and recognize the test mode when any of the test control signals TESZ1-3 is at the high logic level. Incidentally, the real sub-word activation signals QWLX0-3 from the quarter drivers QDRV are also supplied to dummy sub-word decoders DSWD shown in FIG. 3. Namely, the real sub-word activation signals QWLX0-3 function as dummy sub-word activation signals.

The sub-word decoder SWD is formed for each main word line MWLX0-31. The sub-word decoder SWD which receives the main word line MWLX activated to the low logic level, in synchronization with the activation of the word activation signal QWLX0-3, activates its corresponding real sub-word line SWL (word line WL) to a high logic level. For example, the high logic level of the sub-word line SWL is a boosted voltage VPP, and a low logic level of the sub-word line SWL is a negative voltage VNN.

Figure 3:
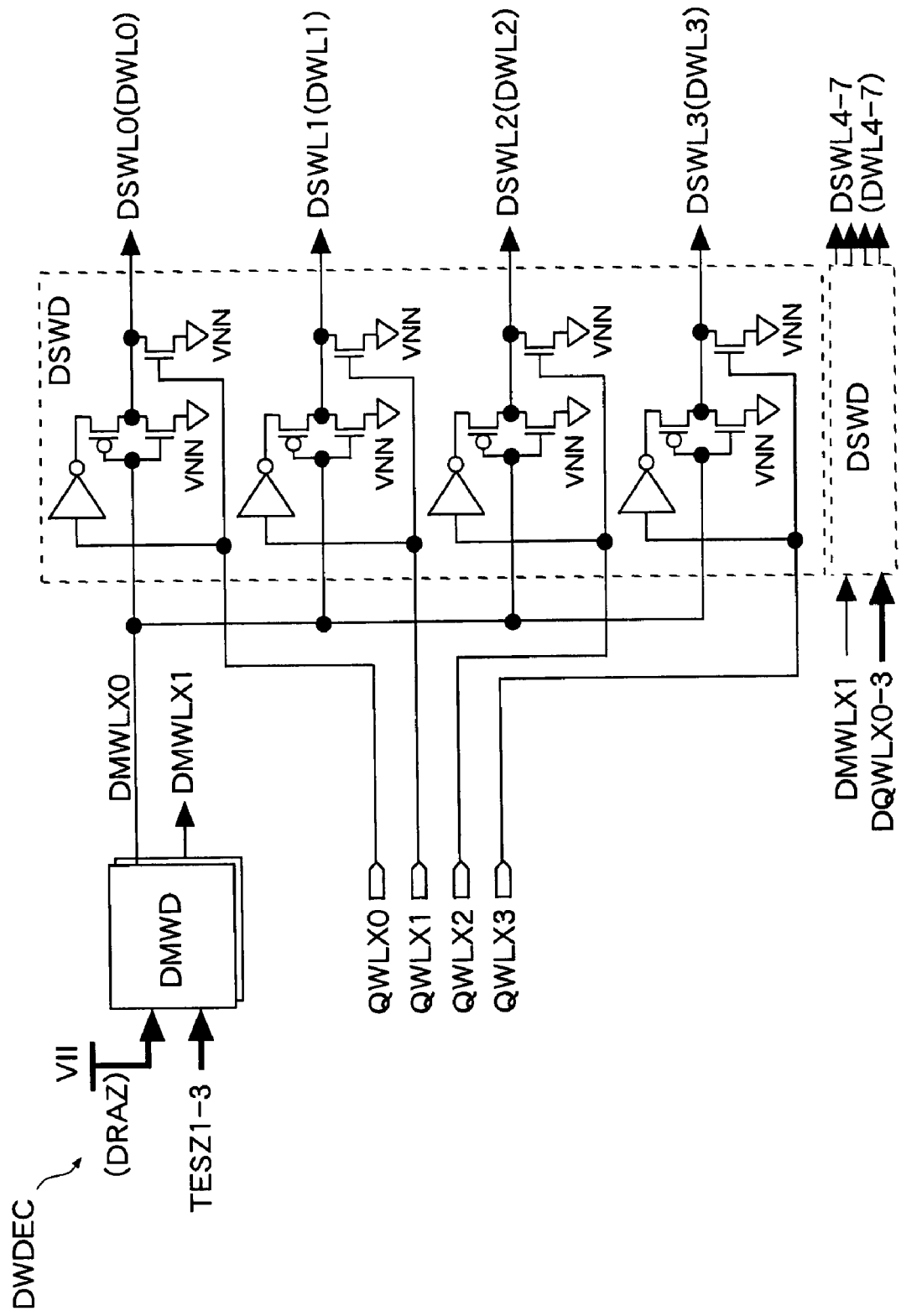
FIG. 3 is a block diagram showing details of a dummy word decoder shown in FIG. 1.

FIG. 3 shows details of the dummy word decoder DWDEC shown in FIG. 1. A detailed description of circuits having the same configurations as those of the word decoder WDEC shown in FIG. 2 is omitted. The dummy word decoder DWDEC includes dummy main word decoders DMWD and dummy sub-word decoders DSWD. The dummy main word decoder DMWD has the same circuit configuration as the real main word decoder MWD shown in FIG. 2 except that a terminal receiving a dummy decode signal DRAZ is connected to a power supply line VII. The dummy sub-word decoder DSWD has the same circuit configuration as the real sub-word decoder SWD and receives the real sub-word activation signals QWLX0-3. Incidentally, as will be described in a second embodiment and so on discussed later, the dummy decode signal DRAZ is used when data is inputted/outputted to/from the dummy memory cell MC.

The dummy main word decoders DMWD activate the dummy main word lines DMWLX (DMWLX0-1) to a low logic level in response to the test control signal TESZ1-3 during the test mode. The dummy main word decoders DMWD inactivate all the dummy main word lines DMWLX0-1 to a high logic level while all the test control signals TESZ1-3 are at the low logic level (during the normal operation mode).

The dummy sub-word decoder DSWD is formed for each dummy main word line DMWLX0-1. The dummy sub-word decoder DSWD which receives the dummy main word line DMWLX activated to the low logic level, in synchronization with the activation of the word activation signal QWLX0-3, activates its corresponding dummy sub-word line DSWL (dummy word line DWL) to a high logic level. For example, the high logic level of the dummy sub-word line DSWL is the boosted voltage VPP, and a low logic level of the sub-word line DSWL is the negative voltage VNN.

Figure 4:
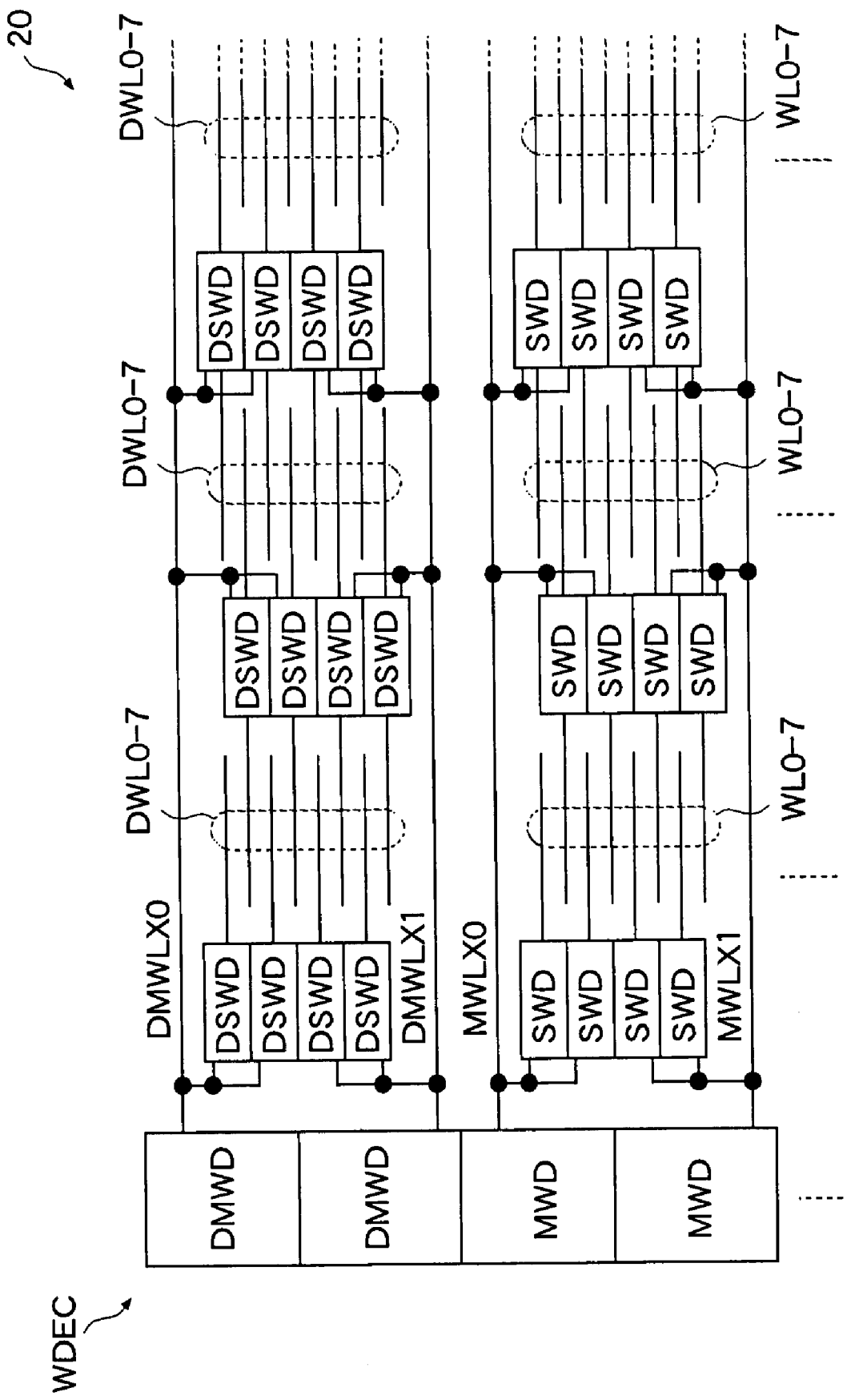
FIG. 4 is a block diagram showing a substantial part of a memory core shown in FIG. 1.

FIG. 4 shows a substantial part of the memory core 20 shown in FIG. 1. As shown, in the actual memory core 20, the sub-word decoders SWD are placed on both end sides of the real word lines WL. The dummy sub-word decoders DSWD are placed on both end sides of the dummy word lines DWL. In other words, the word lines WL, DWL are wired in a so-called comb shape. Unlike the figure, all the intervals between the word lines WL, DWL are the same.

Figure 5:
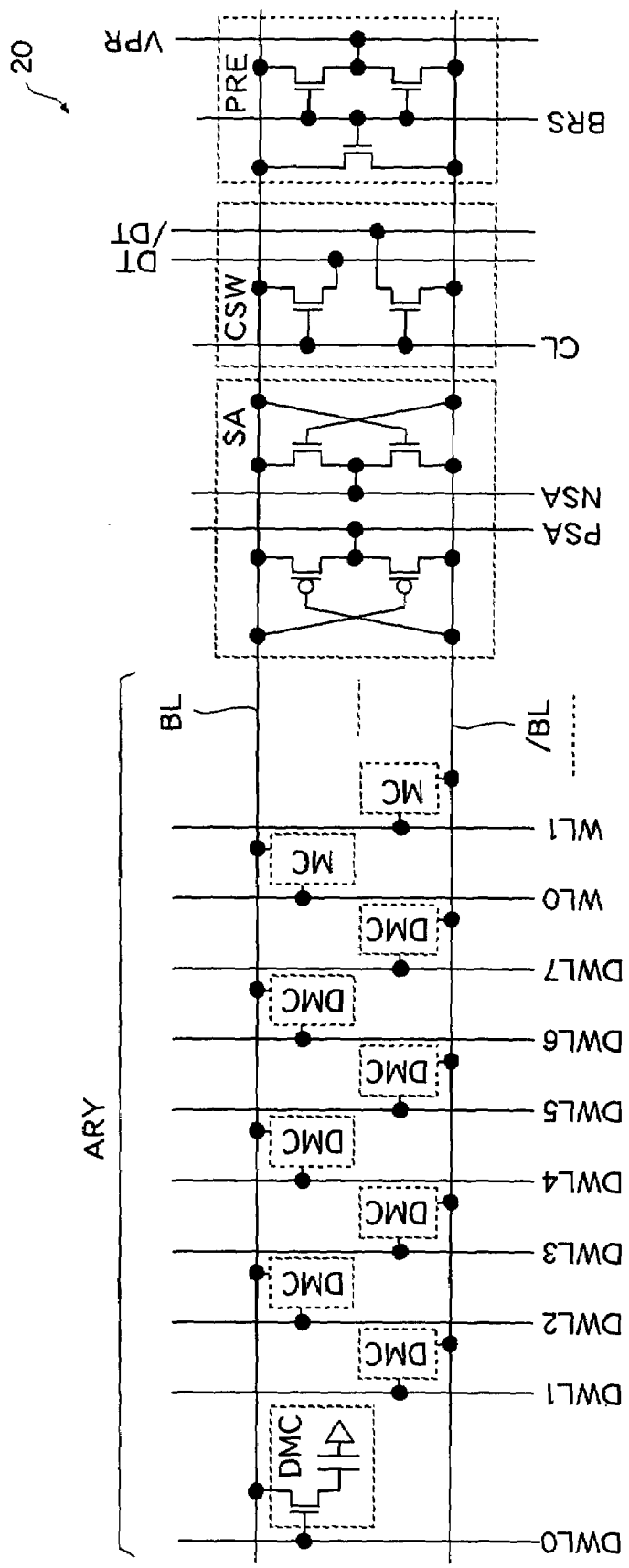
FIG. 5 is a circuit diagram showing details of the memory core shown in FIG. 1.

FIG. 5 shows details of the memory core 20 shown in FIG. 1. As shown in FIG. 1, the real word lines WL and the dummy word lines DWL are connected to the common bit lines BL, /BL, and connected to the sense amplifier SA, and so on via the bit lines BL, /BL.

The sense amplifier SA is constituted of a pair of CMOS inverters whose inputs and outputs are mutually connected. The input (a gate of a transistor) of each CMOS inverter is connected to the bit line BL (or /BL). The respective CMOS inverters are constituted of nMOS transistors and pMOS transistors arranged in a lateral direction of the figure. A source of the pMOS transistor of each CMOS inverter receives a sense amplifier activation signal PSA. A source of the nMOS transistor of each CMOS inverter receives a sense amplifier activation signal NSA. The sense amplifier activation signals PSA, NSA are activated in synchronization with activation of the sense amplifier activation signal LEZ.

The column switch CSW is constituted of an nMOS transistor which connects the bit line BL to a data line DT and an nMOS transistor which connects the bit line /BL to a data line /DT. Gates of the respective nMOS transistors receive a column selection signal CL. The column selection signal CL is activated in synchronization with the column control signal CLZ. In the read operation, read data signals on the bit lines BL, /BL amplified by the sense amplifier SA are transmitted to the data lines DT, /DT via the column switch CSW. In the write operation, write data signals supplied via the data lines DT, /DT are written into the memory cell MC via the bit lines BL, /BL. The data lines DT, /DT are connected to the read amplifier RA and the write amplifier WA.

The precharge circuit PRE is constituted of a pair of nMOS transistors to connect the complementary bit lines BL, /BL to the precharge voltage line VPR, respectively, and an nMOS transistor to connect the bit lines BL, /BL to each other. Gates of the nMOS transistors of the precharge circuit PRE receive the precharge control signal BRS. While receiving the high logic level precharge control signal BRS, the precharge circuit PRE supplies the precharge voltage VPR to the bit lines BL, /BL and also equalizes the voltages of the bit lines BL, /BL.

Figure 6:
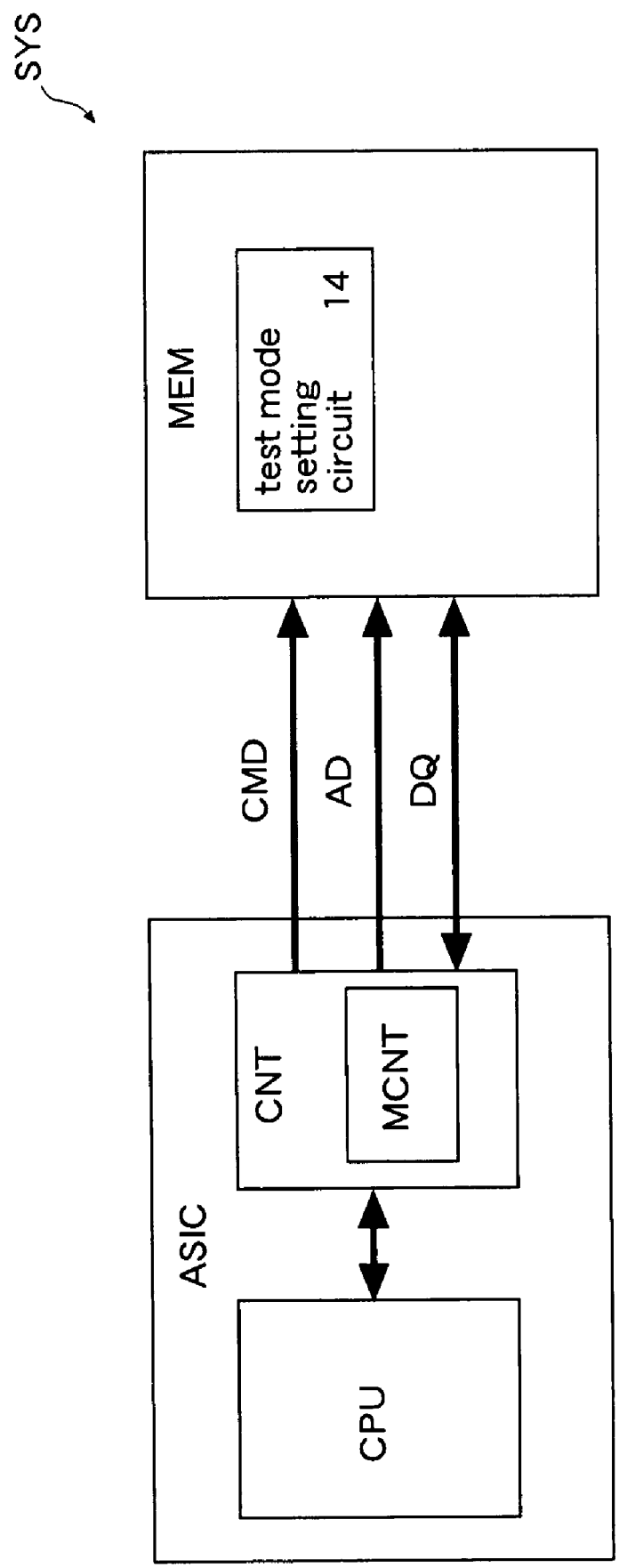
FIG. 6 is a block diagram showing a system on which a memory shown in FIG. 1 is mounted.

FIG. 6 shows a system SYS on which the memory MEM shown in FIG. 1 is mounted. The system SYS includes, for example, the memory chip MEM and an ASIC (logic chip) which accesses the memory chip MEM. The ASIC includes for example, a CPU and a controller CNT. Incidentally, the system SYS may be constituted with memories MEM of other embodiments described later.

The controller CNT includes a memory control unit MCNT which outputs the access command CMD, the address AD, and the write data DQ to access the memory MEM and receives the read data DQ from the memory MEM. The memory control unit MCNT also operates as a test control unit which outputs the test mode command TMD and the address AD to set the test mode setting circuit 14. By the setting of the test mode setting circuit 14, the operating state of the memory MEM shifts from the normal operation mode to the test mode or shift from the test mode to the normal operation mode. A test on the memory MEM performed during the test mode will be described in FIG. 8 to FIG. 11.

Figure 7:
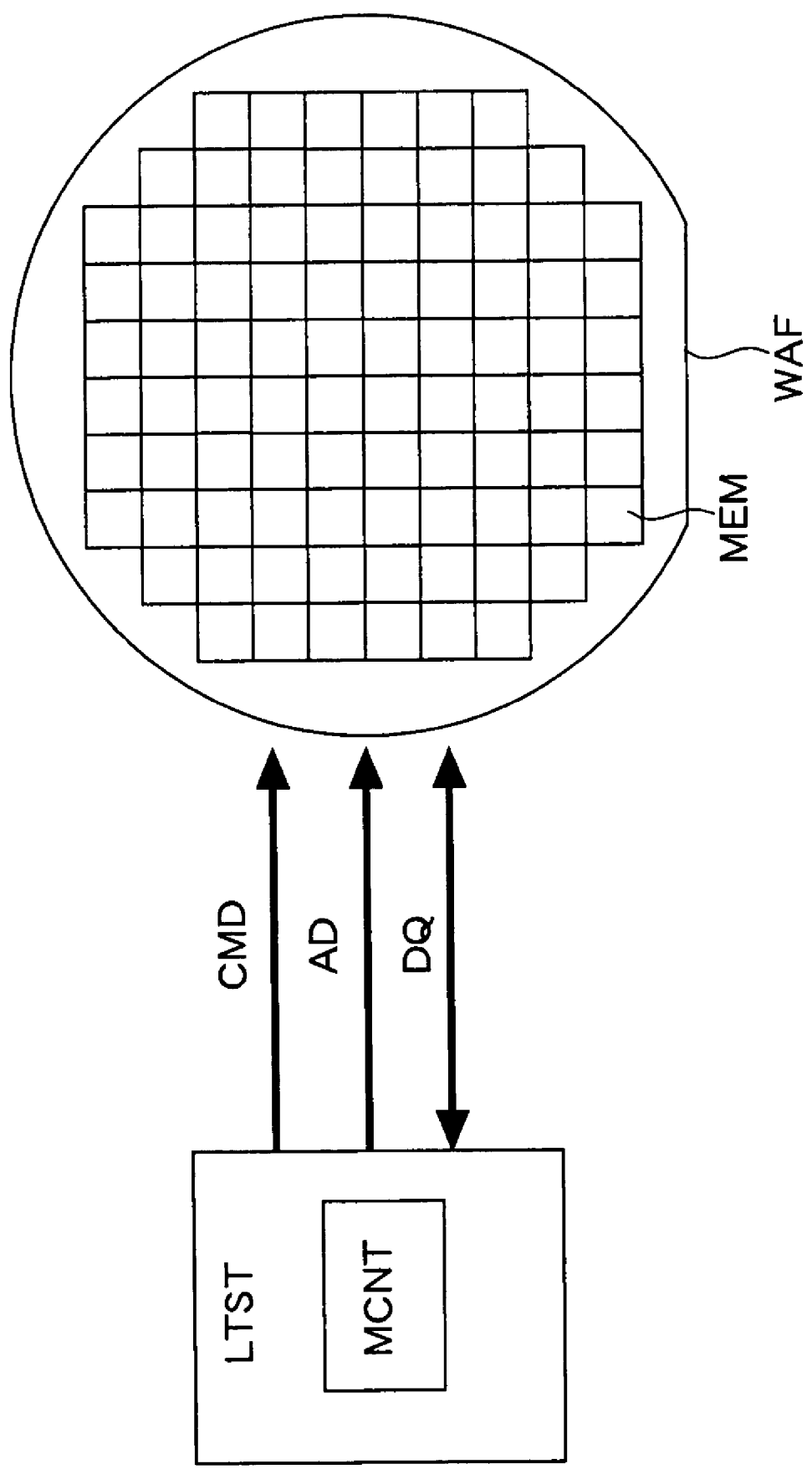
FIG. 7 is a block diagram showing another example of the system on which the memory shown in FIG. 1 is mounted.

FIG. 7 shows another example of the system SYS on which the memory MEM shown in FIG. 1 is mounted. In this example, the system SYS is constituted of a semiconductor wafer WAF on which the memories MEM are formed and an LSI tester LTST which accesses the memory MEM on the wafer WAF to perform a test. Incidentally, the system SYS may be used to test the memories MEM of other embodiments described later.

The LSI tester LTST includes the memory control unit MCNT which tests the memory MEM. The memory control unit MCNT also operates as the test control unit which outputs the test mode command TMD and the address AD to set the test mode setting circuit 14. For example, the LSI tester LTST sets all the memories MEM on the wafer WAF to the test mode by the test mode command TMD and performs a wafer-level burn-in test WLBI. Details of the burn-in test WLBI will be described in FIG. 8 to FIG. 11. Incidentally, the memory MEM may be connected to the LSI tester LTST in a chip state or a packaged state without being limited to a wafer state.

Figure 8:
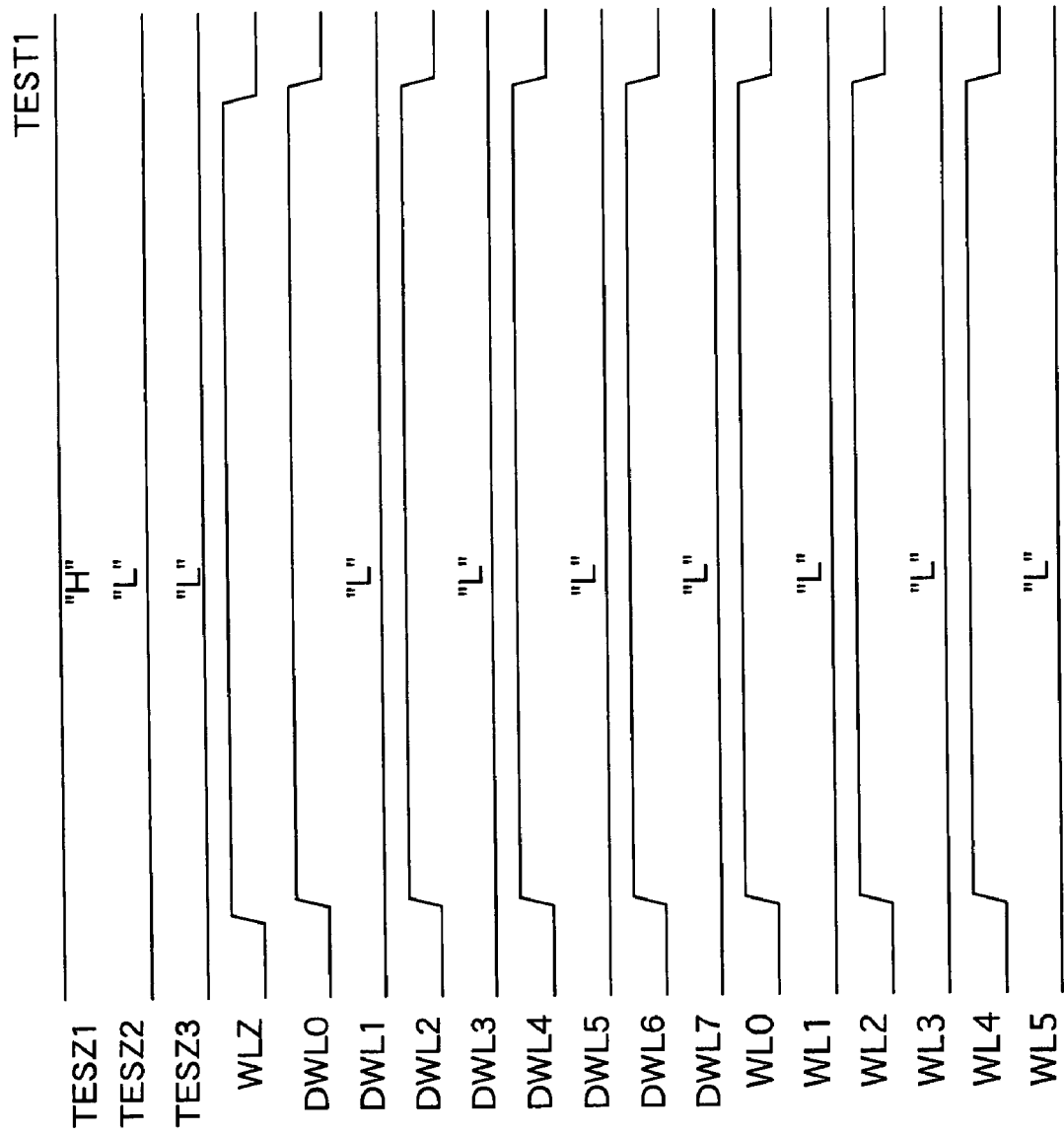
FIG. 8 is a timing chart showing an operation of the memory in a test mode of the first embodiment.

FIG. 8 shows an operation of the memory MEM in the test mode of the first embodiment. In this example, by the setting of the test mode setting circuit 14, only the test control signal TESZ1 is activated to the high logic level, and the memory MEM performs a first stress test TEST1.

In the first stress test TEST1, the main word decoders MWD shown in FIG. 2 and the dummy main word decoders DMWD shown in FIG. 3 activate all the main word lines MWLX0-31 and all the dummy main word lines DMWL0-1 during the activation of the test control signal TESZ1. The core control circuit 12 shown in FIG. 1 activates the word line activation signal WLZ in response to the access command CMD (read command or write command). The access command CMD is supplied from the controller CNT shown in FIG. 6 or the LSI tester LTST shown in FIG. 7. Incidentally, by supplying the test mode command TMD to start/end the test to the core control circuit 12, the word line activation signal WLZ may be activated in synchronization with the test mode command TMD.

During the activation of the test control signal TESZ1, the real quarter drivers QDRV shown in FIG. 2 activate the even-numbered real word lines WL and the even-numbered dummy word lines DWL, respectively, in synchronization with the word line activation signal WLZ. The activation of the word lines WL, DWL continues while the access command CMD is supplied. Consequently, the word lines WL, DWL are activated on every other line, and stresses are applied between a pair of word lines WL/WL, WL/DWL, DWL/DWL, respectively.

In the present invention, a stress is applied between the real word line WL0 located on the outermost side and the dummy word line DWL7, so that a stress test on the real word line WL0 can be certainly performed. In particular, the activation time of the even-numbered dummy word line DWL and the activation time of the even-numbered real word line WL are equal to the activation time of the word line activation signal WLTZ. Namely, the activation times of the word lines DWL, WL are equal to each other. Moreover, circuit configurations of the sub-word drivers SWD, DSWD are the same as each other. Accordingly, signal waveforms of the real word line WL and the dummy word line DWL can be made equal, and the same voltage stress can be applied to both the word line WL wired on an inner side of the memory cell array ARY and the word line WL wired on an outer side of the memory cell array ARY for the same length of time.

Figure 9:
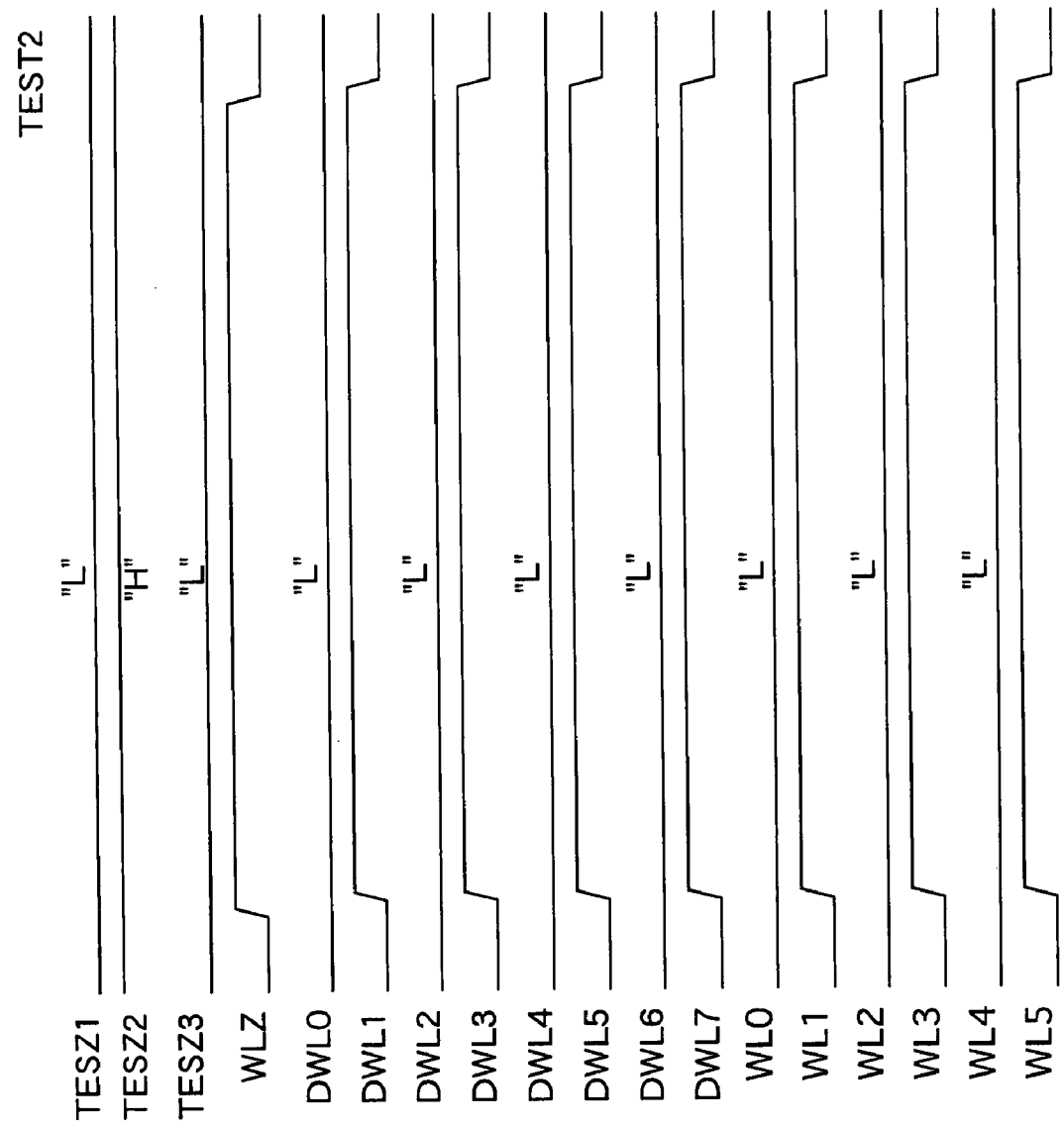
FIG. 9 is a timing chart showing another operation of the memory in the test mode of the first embodiment.

FIG. 9 shows another operation of the memory MEM in the test mode of the first embodiment. A detailed description of the same operation as in FIG. 8 is omitted. In this embodiment, by the setting of the test mode setting circuit 14, only the test control signal TESZ2 is activated to the high logic level, and the memory MEM performs a second stress test TEST2.

Also in the second stress test TEST2, in response to the activation of the test control signal TESZ2, all the main word lines MWLX0-31 and all the dummy main word lines DMWL0-1 are activated. Then, the access command CMD is supplied to the memory MEM from the controller CNT shown in FIG. 6 or the LSI tester LTST shown in FIG. 7, and the word line activation signal WLZ is activated. Incidentally, by supplying the test mode command TMD to start/end the test to the core control circuit 12, the word line activation signal WLZ may be activated in synchronization with the test mode command TMD.

During the activation of the test control signal TESZ2, the quarter drivers QDRV activate the odd-numbered real word lines WL and the odd-numbered dummy word lines DWL in synchronization with the word line activation signal WLZ. The activation of the word lines WL, DWL continues while the access command CMD is supplied. Consequently, the word lines WL, DWL are activated on every other line, and stresses are applied between a pair of word lines WL/WL, WL/DWL, DWL/DWL, respectively. Thus, the same effect as in FIG. 8 can be obtained.

Figure 10:
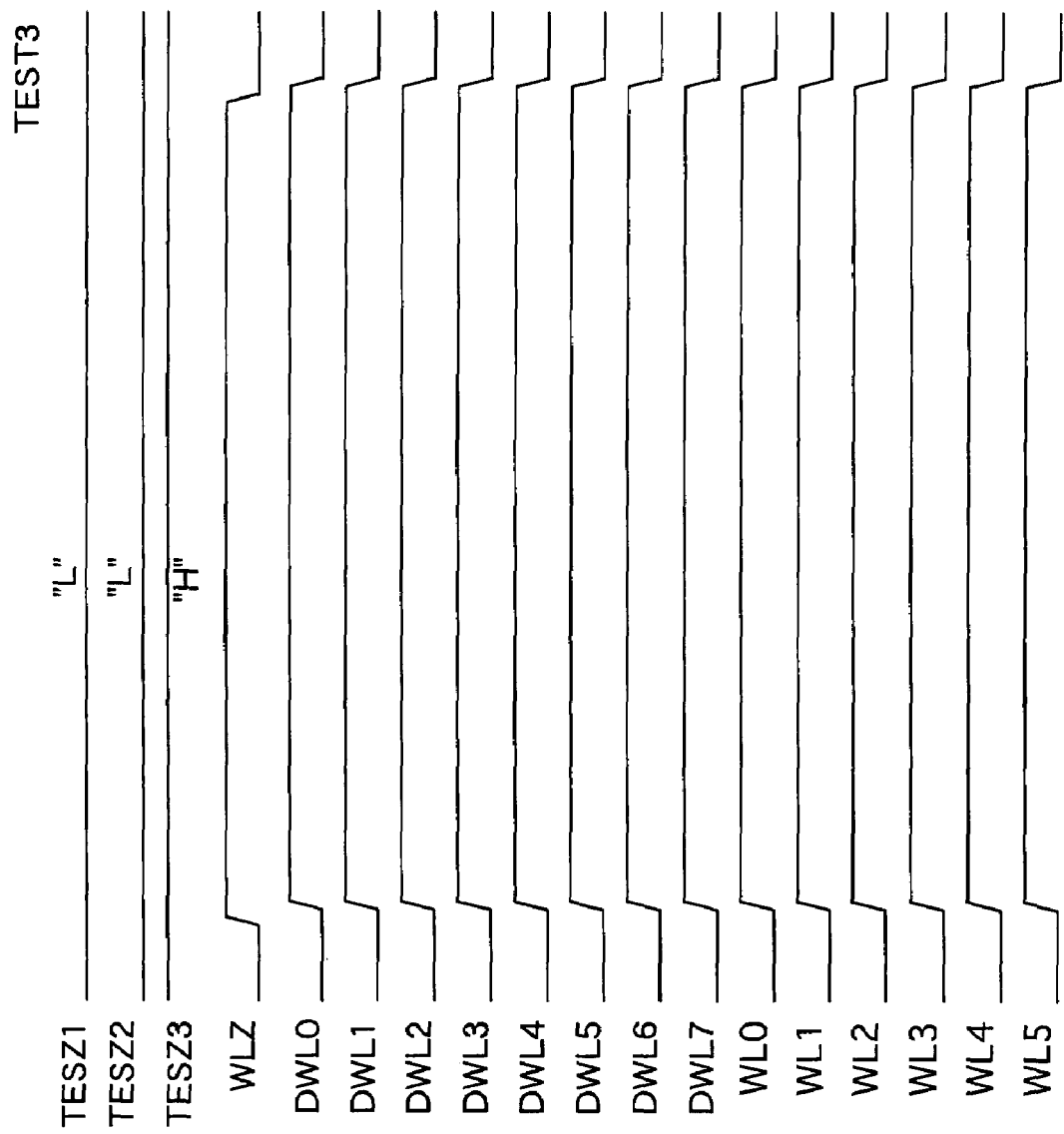
FIG. 10 is a timing chart showing another operation of the memory in the test mode of the first embodiment.

FIG. 10 shows another operation of the memory MEM in the test mode of the first embodiment. A detailed description of the same operation as in FIG. 8 is omitted. In this example, by the setting of the test mode setting circuit 14, only the test control signal TESZ3 is activated to the high logic level, and the memory MEM performs a third stress test TEST3.

Also in the third stress test TEST3, in response to the activation of the test control signal TESZ3, all the main word lines MWLX0-31 and all the dummy main word lines DMWL0-1 are activated. Then, the access command CMD is supplied to the memory MEM, and the word line activation signal WLZ is activated.

During the activation of the test control signal TESZ3, the real quarter drivers QDRV activates all of the real word lines WL and the dummy word lines DWL in synchronization with the word line activation signal WLZ. The activation of the word lines WL, DWL continues while the access command CMD or the test mode command TCMD is supplied. Consequently, stresses are applied between the word lines WL, DWL and the memory cells MC, DMC, respectively. In particular, stresses are applied to the gates of the transfer transistors of the memory cells MC, DMC. Also, stresses are applied between the adjacent word lines WL/WL, WL/DWL, DWL/DWL (acceleration test of migration). Also in FIG. 10, waveforms of the real word line WL and the dummy word line DWL are the same, so that the same voltage stress can be applied to both the word line WL wired on the inner side of the memory cell array ARY and the word line WL wired on the outer side of the memory cell array ARY for the same length of time.

Figure 11:
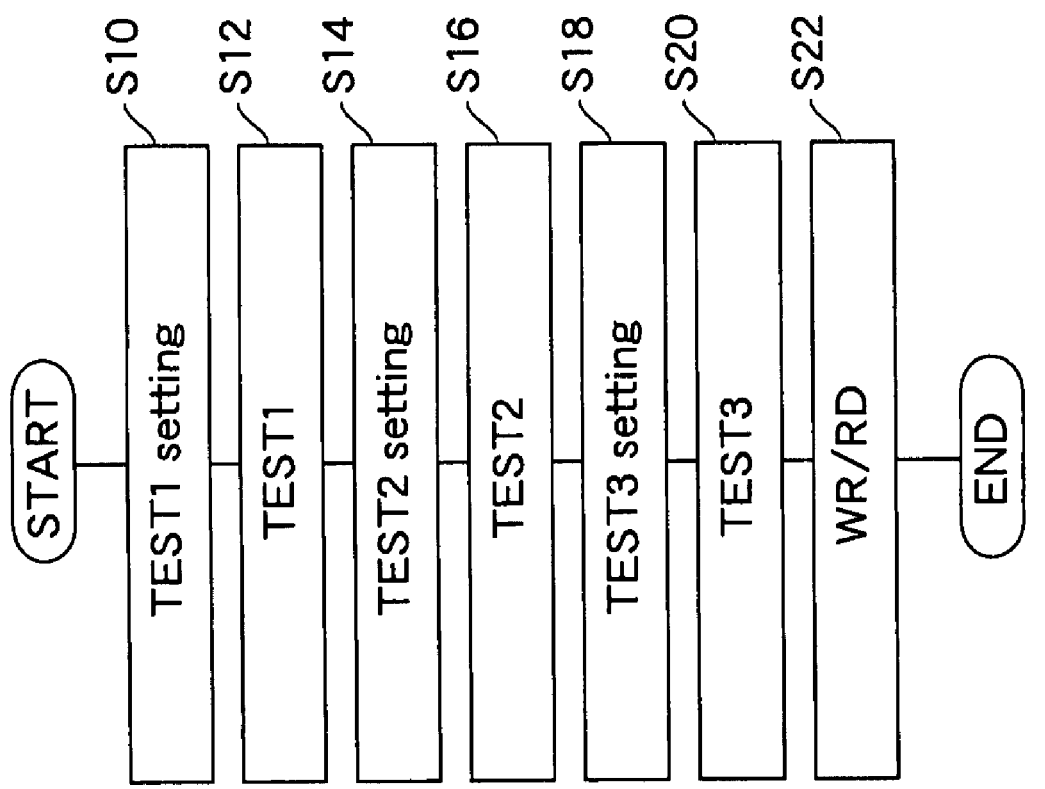
FIG. 11 is a flowchart showing a testing method of the first embodiment.

FIG. 11 shows a flow of a testing method of the first embodiment. This flow is performed, for example, by the controller CNT shown in FIG. 6 or the LSI tester LTST shown in FIG. 7. The test may be performed on the individual memory MEM in the chip state or the packaged state, or may be performed on the memory MEM in the wafer state.

First, in step S10, the test mode command TMD to perform the first stress test TEST1 is supplied to the test mode setting circuit 14. By the setting of the test mode setting circuit 14, the first stress test TEST1 shown in FIG. 8 is performed in step S12.

Then, in step S14, the test mode command TMD to perform the second stress test TEST2 is supplied to the test mode setting circuit 14, and the second stress test TEST2 shown in FIG. 9 is performed in step S16. Subsequently, in step S18, the test mode command TMD to perform the third stress test TEST3 is supplied to the test mode setting circuit 14, and the third stress test TEST3 shown in FIG. 10 is performed in step S20.

Thereafter, in step S22, the write command WD is supplied to the memory MEM, and data of a predetermined pattern is written to all the memory cells MC. Here, the predetermined pattern is, for example, an all "0" pattern, an all "1" pattern, a marching pattern, or the like. Then, the read command RD is supplied to the memory MEM, and data is read from all the memories MC. If the read data matches an expected value (write data), this memory MEM is determined as a good product. If the read data does not match the expected value, this memory MEM is determined as a bad product. Namely, the burn-in test is performed. Incidentally, in the test, instead of performing all the stress tests TEST1-3, at least any of the stress tests TEST1-3 may be performed.

As described above, in the first embodiment, by driving the real word line WL and the dummy word line DWL using the word line activation signal WLTZ being the common timing signal, the waveforms of the real word line WL and the dummy word line DWL can be made the same. Accordingly, the same voltage stress can be applied to both the word line WL wired on the inner side of the memory cell array ARY and the word line WL wired on the outer side of the memory cell array ARY for the same length of time. The stress test can be performed under the same condition, so that the real word line WL and the real memory cell MC adjacent to the dummy word line DWL can be fully evaluated. This can prevent failures from occurring in the market. Namely, the reliability of the semiconductor memory MEM can be improved.

Since the shift from the normal operation mode to the test mode is performed by accessing the test mode setting circuit 14, an external terminal such as a test mode terminal need not be formed. The external terminal (pad) has a larger layout area, compared to a device such as a transistor. Further, the area of the pad tends to become relatively larger as the semiconductor technology advances. Hence, an increase in the chip size of the memory MEM due to the test pad can be prevented.

By activating any of the test control signals TESZ1-3 in response to the address AD, the case where the number of test types is increased can also be easily coped with out the command sequence being changed. For example, a change in the logic of the memory control unit MCNT which tests the memory MEM or the like becomes unnecessary. Further, it becomes possible that the test mode setting circuit 14 is included in the mode register to set the operating specification of the memory MEM.

Figure 12:
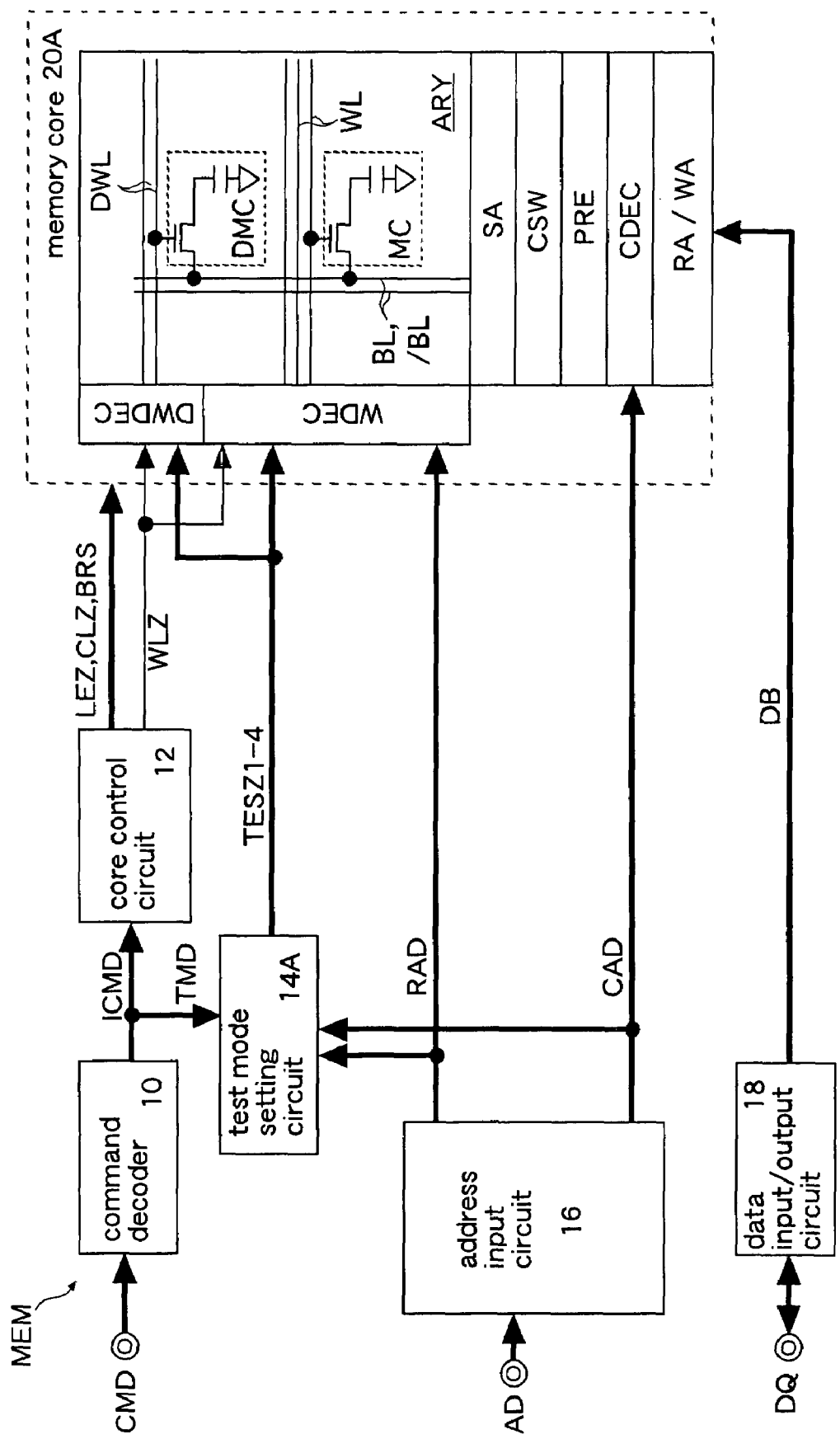
FIG. 12 is a block diagram showing a second embodiment of the present invention.

FIG. 12 shows a second embodiment of the present invention. The same symbols are used to designate the same elements as those described in the first embodiment, and a detailed description thereof is omitted. In this embodiment, a test mode setting circuit 14A and a memory core 20A are formed instead of the test mode setting circuit 14 and the memory core 20 of the first embodiment. The other constitutions are the same as in the first embodiment.

The test mode setting circuit 14A is constituted by adding a function of activating a test control signal TESZ4 in response to the address AD (RAD, CAD; second external signal) to the function of the test mode setting circuit 14 of the first embodiment. For example, when the column address CAD of "04" in hexadecimal is supplied with the test mode command TMD, the test mode setting circuit 14A activates the test control signal TESZ4. By the activation of the test control signal TESZ4, a fourth stress test is performed. The fourth stress test is a disturb stress test in which only one of the real word lines WL or the dummy word lines DWL is activated to evaluate the influence of the voltage change of the adjacent word lines WL, DWL on coupling and so on.

Incidentally, the stress tests TEST1-3 performed by the activation of the test control signals TESZ1-3 are the same as those in the first embodiment (FIGS. 8-10). The memory core 20A is the same as the memory core 20 of the first embodiment except that the constitutions of the real word decoder WDEC and the dummy word decoder DWDEC differ from those in the first embodiment.

Figure 13:
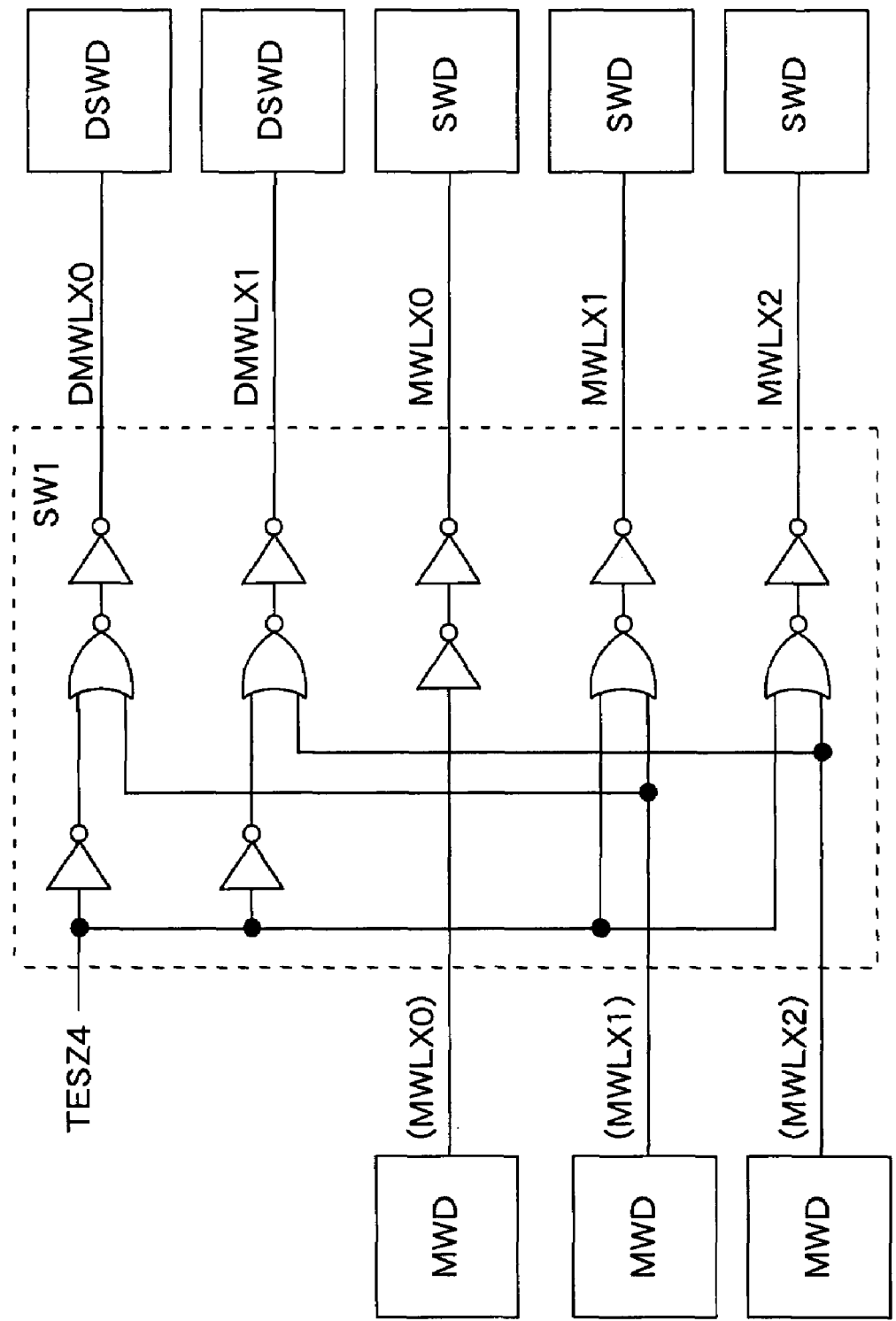
FIG. 13 is a circuit diagram showing a substantial part of a real word decoder shown in FIG. 12.

FIG. 13 shows a substantial part of the real word decoder WDEC shown in FIG. 12. The word decoder WDEC is constituted by placing a switch circuit SW1 at outputs of the main word decoders MWD connected to the main word lines MWLX0-2. The other constitutions are the same as those of the word decoder WDEC of the first embodiment.

The switch circuit SW1 outputs main word line signals MWLX1-2 outputted from the real main word decoders MWD to the real sub-word decoders SWD during inactivation of the test control signal TESZ4 (during the normal operation mode or during the stress tests TEST1-3). The switch circuit SW1 outputs the main word line signals MWLX1-2 outputted from the real main word decoders MWD as the dummy word line signals DMWLX0-1 to the dummy sub-word decoders DSWD during the activation of the test control signal TESZ4 (during the fourth stress test). Drivabilities of final-stage buffers (inverters) of the switch circuit SW1 are all the same.

Incidentally, in actuality, to make the functions of the stress tests TEST1-3 valid, the dummy main word line signals DMWLX0-1 outputted from the switch circuit SW1 are outputted to the dummy sub-word decoders DSWD via the dummy main word decoders DMWD. The dummy main word decoders DMWD activate all the dummy main word line signals DMWLX0-1 during the activation of the test control signals TESZ1-3 and output the dummy main word line signals DMWLX0-1 from the switch circuit SW1 during the activation of the test control signal TESZ4.

In this embodiment, the fourth stress test TEST4 is performed during the test mode in which the test mode setting circuit 14A activates the test control signal TESZ4. When the row address RAD (first address) to select the main word line MWLX1 or MWLX2 is supplied during the fourth stress test TEST4, the dummy main word line DMWLX0 or DMWLX1 is activated instead of the main word line MLX1-2. Thereby, when the first address is supplied during the fourth stress test TEST4, any one of the dummy word lines DWL is selectively activated according to lower two bits of the row address RAD. Then, data is inputted/outputted to/from the dummy memory cell DMC. Namely, transfer transistors of the switch circuit SW1 and memory cells MC, DMC function as a data control circuit which releases a connection between the data input/output circuit 18 and the real memory cell MC and connects the data input/output circuit 18 to the dummy memory cell DMC.

On the other hand, when the row address RAD other than the first address is supplied during the fourth stress test TEST4, the main word line MWLX other than the main word lines MWLX1-2 is activated. As described above, the sub-word decoders SWD and the dummy word decoders DSWD drive the word lines WL, DWL one by one according to the row addresses RAD from the memory control unit MCNT shown in FIG. 6 or FIG. 7.

In the fourth stress test TEST4, the real word line WL and the dummy word line DWL are activated in synchronization with the word line activation signal WLTZ by the common real main word decoder MWD. The activation timings of the real word line WL and the dummy word line DWL are the same as each other. Thus, the disturb stress test can be performed on both the word line WL wired on the inner side of the memory cell array ARY and the word line WL wired on the outer side of the memory cell array ARY under exactly the same condition. In other words, the stress test on the word line WL wired on the outer side of the memory cell array ARY can be fully performed.

As described above, also in the second embodiment, the same effect as in the above first embodiment can be obtained. Further, in this embodiment, the test conditions such as the activation timings of the real word lines WL and the dummy word lines DWL activated one by one can be made equal to each other. Consequently, the disturb stress test can be performed under exactly the same condition independently of the position of the wired word line WL.

Figure 14:
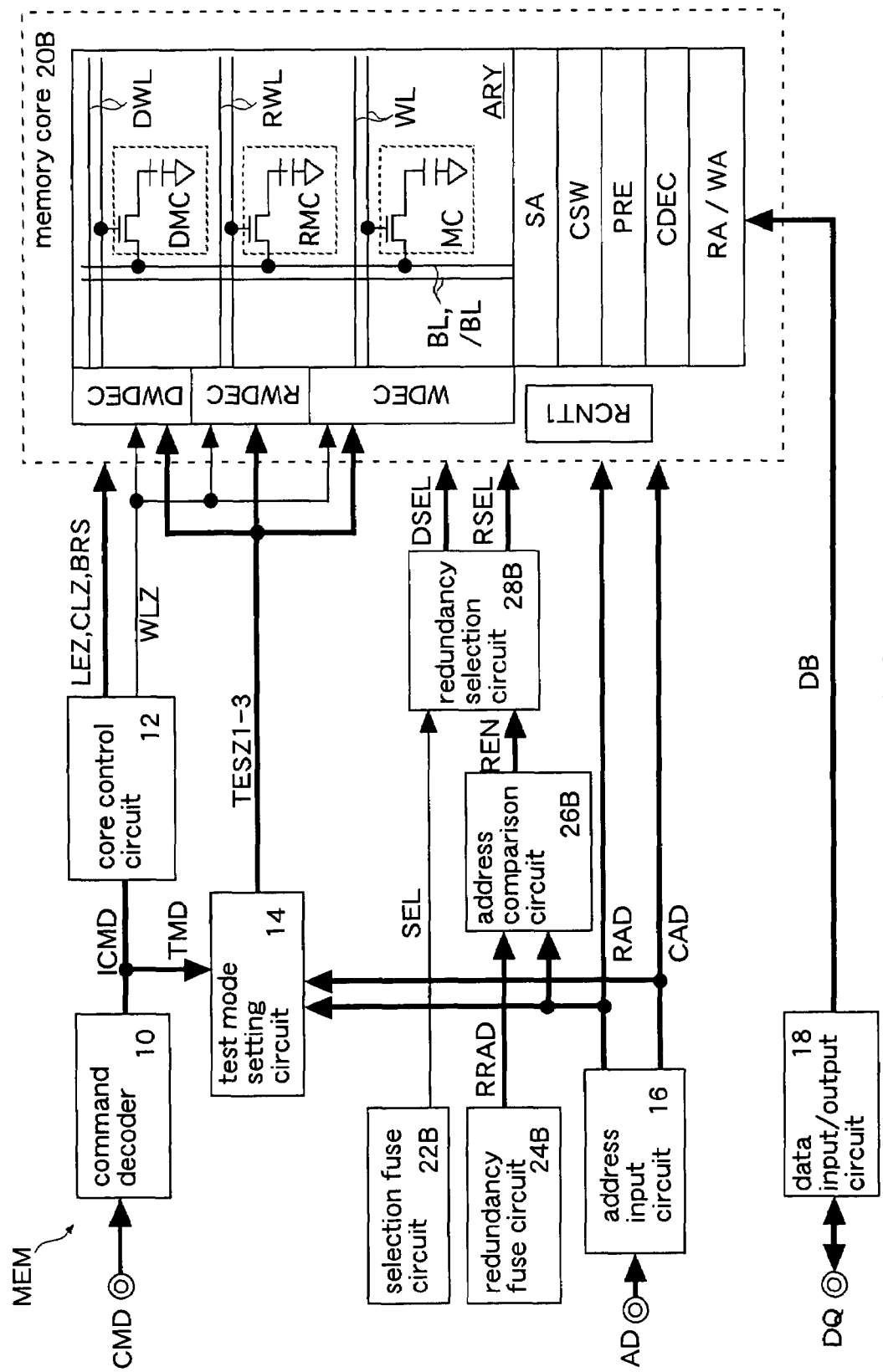
FIG. 14 is a block diagram showing a third embodiment of the present invention.

FIG. 14 shows a third embodiment of the present invention. The same symbols are used to designate the same elements as those described in the first embodiment, and a detailed description thereof is omitted. In this embodiment, a memory core 20B is formed instead of the memory core 20 of the first embodiment. Further, a selection fuse circuit 22B, a redundancy fuse circuit 24B, an address comparison circuit 26B, and a redundancy selection circuit 28B are newly formed. The other constitutions are the same as in the first embodiment. Incidentally, it is also possible to replace the memory core 20 of the second embodiment with the memory core 20B and further newly form the selection fuse circuit 22B, the redundancy fuse circuit 24B, the address comparison circuit 26B, and the redundancy selection circuit 28B.

The memory core 20B is constituted by adding a redundancy control circuit RCNT1, a redundancy word decoder RWDEC, redundancy memory cells RMC, and a redundancy word line RWL connected to the redundancy memory cells RMC.

The redundancy fuse circuit 24B (first redundancy memory circuit) includes a fuse which stores a redundancy row address RRAD (defect address) indicating the word line WL having a failure. The redundancy fuse circuit 24B outputs the redundancy row address RRAD according to a programmed state of the fuse. The selection fuse circuit 22B (second redundancy memory circuit) includes a fuse which stores defect information indicating that a failure exists in the redundancy word line RWL or the redundancy memory cell RMC. The selection fuse circuit 22B outputs a selection signal SEL according to a programmed state of the fuse. The selection fuse circuit 22B inactivates the selection signal SEL when the fuse is not programmed, and activates the selection signal SEL when the fuse is programmed. The inactivated selection signal SEL indicates that the redundancy word line RWL is used when the failure is relieved. The activated selection signal SEL indicates that the dummy word line DWL is used when the failure is relieved.

The address comparison circuit 26B outputs a redundancy enable signal REN when the row address RAD and the redundancy row address RRAD match. When the redundancy enable signal REN is activated, the redundancy selection circuit 28B outputs a redundancy selection signal RSEL or a dummy selection signal DSEL in response to the selection signal SEL.

The redundancy control circuit RCNT1 disables driving of the real word line WL corresponding to the defect address stored in the redundancy fuse circuit 24B and instead enables driving of the redundancy word line RWL. Further, the redundancy control circuit RCNT1 enables driving of the dummy word line DWL instead of the redundancy word line RWL when the defect information indicating the failure in the redundancy word line RWL is stored in the redundancy fuse circuit 22B. Namely, the memory core 20B activates the redundancy word line RWL instead of the real word line WL when receiving the redundancy selection signal RSEL and activates the dummy word line DWL instead of the redundancy word line RWL when receiving the dummy selection signal RSEL. The redundancy memory cell RMC has the same shape and characteristic as the real memory cell MC.

In this embodiment, when a failure exists in the real word line WL or the real memory cell MC, the failure is relieved by using the redundancy word line RWL. Further, when a failure exists in the redundancy word line RWL or the redundancy memory cell RMC, the failure is relieved by using the dummy word line DWL (DWL4-7 shown in FIG. 3). A stress evaluation on the dummy word lines DWL4-7 is performed by the stress tests TEST1-3 described in the first embodiment under the same condition as that of the real word line WL. Therefore, the dummy word line DWL4-7 can be used instead of the real word line WL. Namely, the dummy word line DWL4-7 can be used instead of the redundancy word line RWL to relieve the failure. Incidentally, when plural redundancy word lines RWL are formed, plural selection signals SEL corresponding to the respective redundancy word lines RWL may be outputted from the selection fuse circuit 22B. Thereby, plural dummy word lines DWL can be used instead of the plural redundancy word lines RWL. This goes for a fourth and fifth embodiments described later.

As described above, also in the third embodiment, the same effect as in the above first embodiment can be obtained. Further, in this embodiment, when a failure exists in the redundancy word line RWL or the redundancy memory cell RMC, the failure can be relieved using the dummy word line DWL. Consequently, the yield of the memory MEM can be improved.

Figure 15:
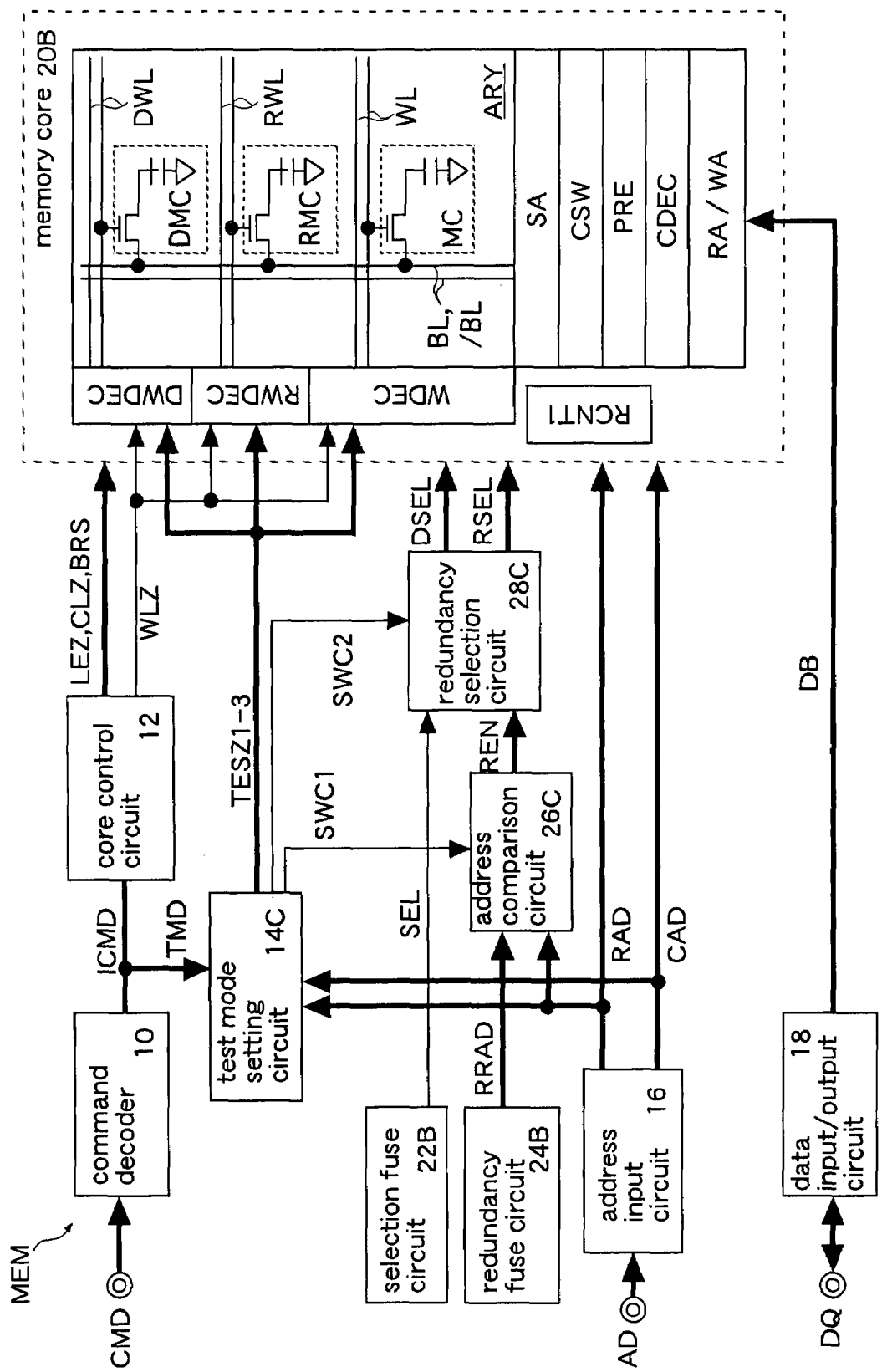
FIG. 15 is a block diagram showing a fourth embodiment of the present invention.

FIG. 15 shows a fourth embodiment of the present invention. The same symbols are used to designate the same elements as those described in the first and third embodiments, and a detailed description thereof is omitted. In this embodiment, a test mode setting circuit 14C, an address comparison circuit 26C, and a redundancy selection circuit 28C are formed instead of the test mode setting circuit 14, the address comparison circuit 26B, and the redundancy selection circuit 28B of the third embodiment. The other constitutions are the same as in the third embodiment.

The test mode setting circuit 14C is constituted by adding a function of activating switch control signals SWC1, SWC2 in response to the address AD (RAD, CAD: second external signal) to the function of the test mode setting circuit 14 of the first embodiment. The address comparison circuit 26C forcibly outputs the redundancy enable signal REN regardless of the comparison result between the row addresses RRAD, RAD when receiving activation of the switch control signal SWC1. The redundancy selection circuit 26C forcibly outputs the dummy selection signal DSEL regardless of the selection signal SEL when receiving activation of the switch control signal SWC2. Thereby, before the fuse circuits 22B, 24B are programmed, the real word line WL can be replaced with the redundancy word line RWL or the dummy word line DWL by the setting of the test mode setting circuit 14C.

As described above, also in the fourth embodiment, the same effects as in the above first and third embodiments can be obtained. Further, in this embodiment, the real word line WL can be replaced with the redundancy word line RWL or the dummy word line DWL before the fuse circuits 22B, 24B are programmed, so that operations of the word lines RWL, DWL and the memory cells RMC, DMC can be previously confirmed before the fuse circuits 22B, 24B are programmed.

Figure 16:
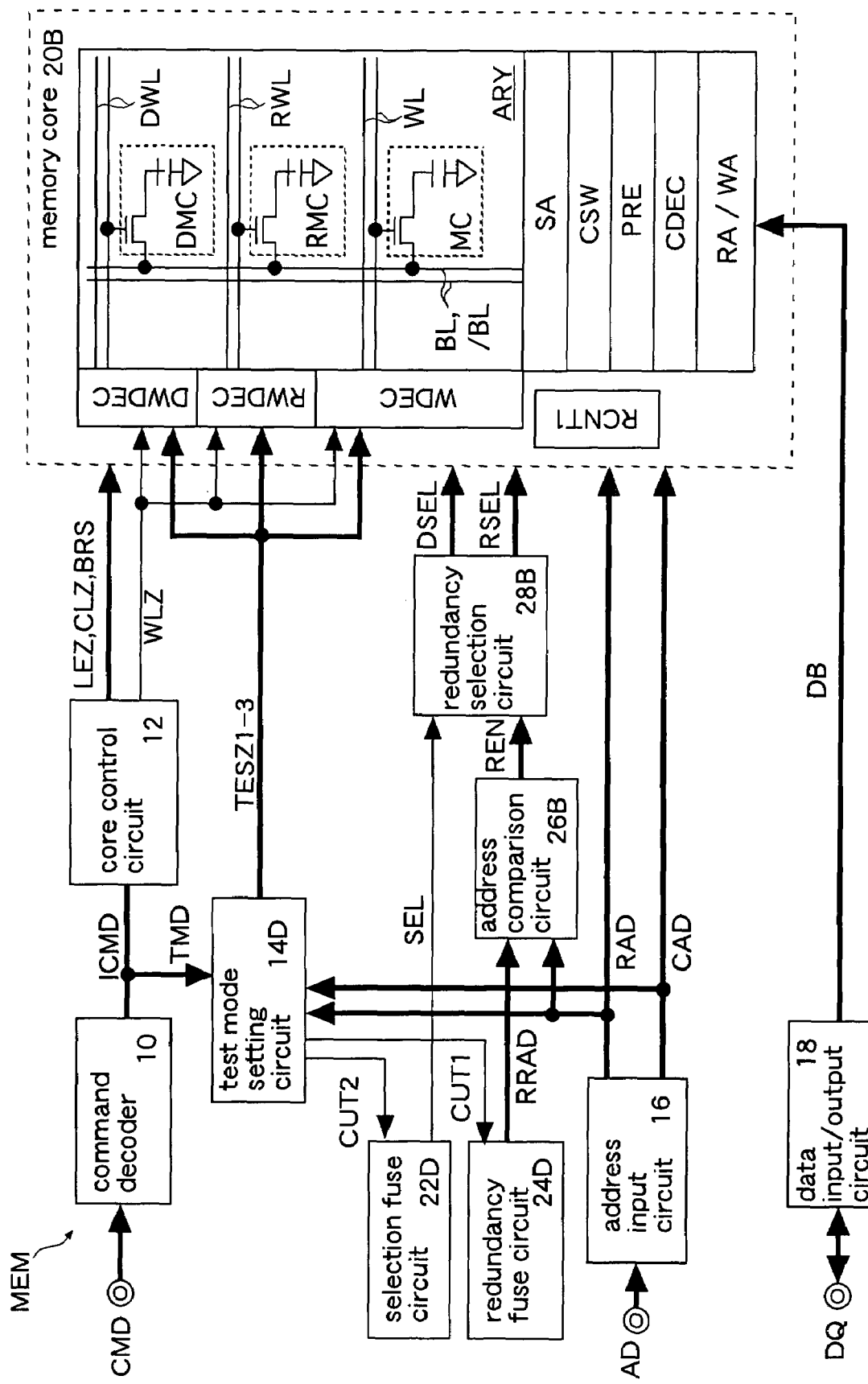
FIG. 16 is a block diagram showing a fifth embodiment of the present invention.

FIG. 16 shows a fifth embodiment of the present invention. The same symbols are used to designate the same elements as those described in the first and third embodiments, and a detailed description thereof is omitted. In this embodiment, a test mode setting circuit 14D, a selection fuse circuit 22D, and a redundancy fuse circuit 24D are formed instead of the test mode setting circuit 14, the selection fuse circuit 22B, and the redundancy fuse circuit 24B of the third embodiment. The other constitutions are the same as in the third embodiment.

The test mode setting circuit 14D is constituted by adding a function of activating cut control signals CUT1, CUT2 in response to the address AD (RAD, CAD: second external signal) to the function of the test mode setting circuit 14 of the first embodiment. The redundancy fuse circuit 24D forcibly outputs the predetermined redundancy row address RRAD regardless of the programmed state of a fuse when receiving activation of the cut control signal CUT1. The selection fuse circuit 22D forcibly activates the selection signal SEL regardless of the programmed state of a fuse when receiving activation of the cut control signal CUT2. Thereby, before the fuse circuits 22D, 24D are programmed, the real word line WL can be replaced with the redundancy word line RWL or the dummy word line DWL by the setting of the test mode setting circuit 14D.

As described above, also in the fifth embodiment, the same effects as in the above first, third, and fourth embodiments can be obtained.

Figure 17:
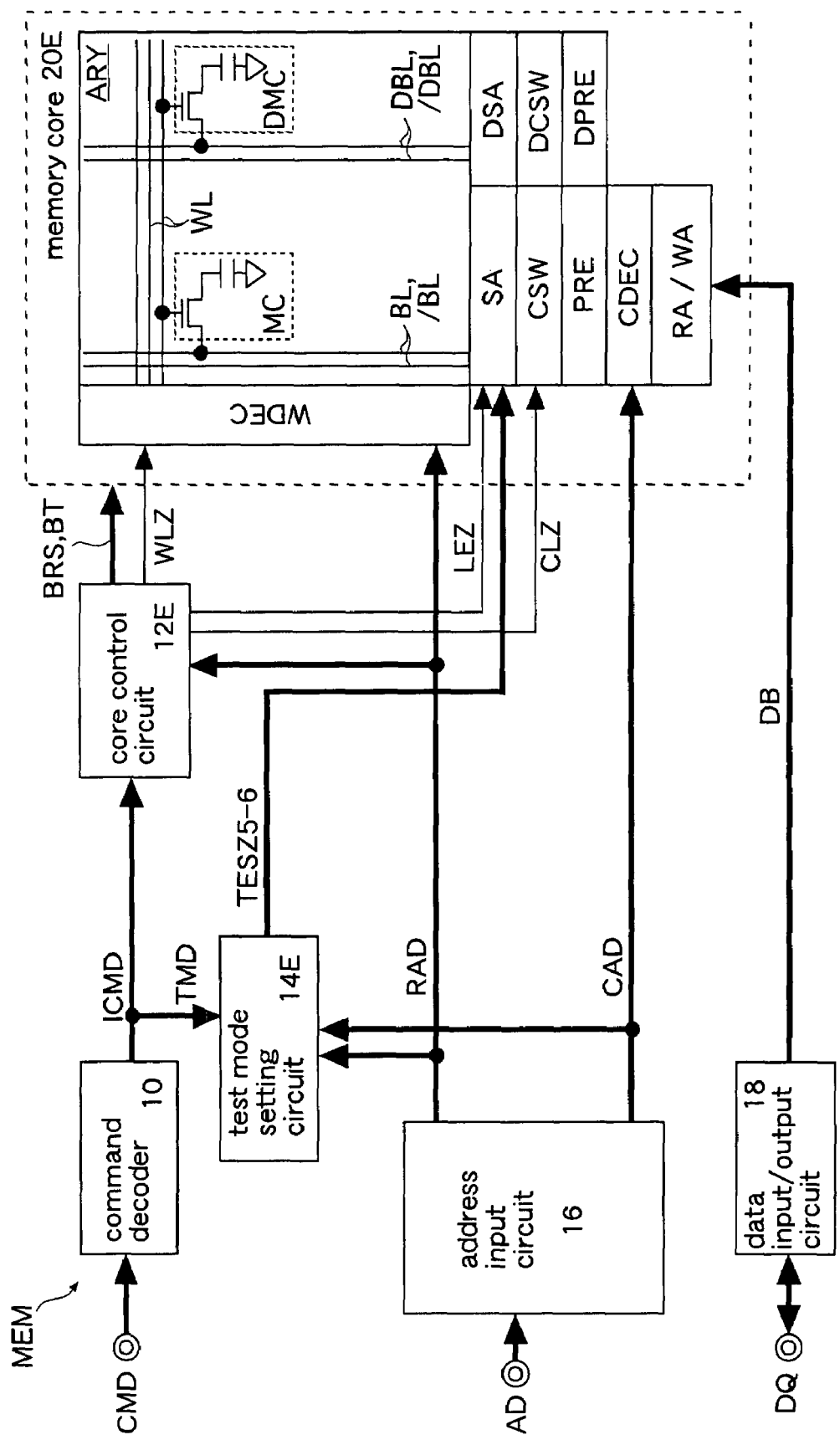
FIG. 17 is a block diagram showing a sixth embodiment of the present invention.

FIG. 17 shows a sixth embodiment of the present invention. The same symbols are used to designate the same elements as those described in the first embodiment, and a detailed description thereof is omitted. In this embodiment, a test mode setting circuit 14E, a core control circuit 12E, and a memory core 20E are formed instead of the test mode setting circuit 14, the core control circuit 12, and the memory core 20 of the first embodiment. The other constitutions are the same as in the third embodiment.

The test mode setting circuit 14E shifts the operation mode of the memory MEM from the normal operation mode to the test mode in response to the test mode command TMD (CMD; first external signal) and activates either of the test control signals TESZ5-6 in response to the address AD (RAD, CAD; second external signal) supplied with the test mode command TMD. For example, when the column addresses CAD of "05", "06" in hexadecimal are supplied with the test mode command TMD, the test mode setting circuit 14E activates the test control signals TESZ5-6, respectively, and when the column address CAD of "FF" in hexadecimal is supplied, shifts the operation mode from the test mode to the normal operation mode. The core control circuit 12E is constituted by adding a function of outputting a switch control signal BT (BT1, BT2, or the like shown in FIG. 19) in response to the row address RAD to the core control circuit 12 of the first embodiment.

The memory core 20E includes the memory cell array ARY, the word decoder WDEC, the real sense amplifier SA, a dummy sense amplifier DSA, the real column switch CSW, a dummy column switch DCSW, the real precharge circuit PRE, a dummy precharge circuit DPRE, the column decoder CDEC, the read amplifier RA, and the write amplifier WA. The memory cell array ARY includes plural real memory cells MC and dummy memory cells DMC, word lines WL connected to the memory cells MC, DMC arranged in a lateral direction of the figure, bit lines BL, /BL connected to the memory cells MC arranged in a longitudinal direction of the figure, and dummy bit lines DBL, /DBL connected to the dummy memory cells DMC arranged in the longitudinal direction of the figure. The memory cells MC, DMC are formed into the same shape and have the same characteristic as each other as in the first embodiment.

The word decoder WDEC decodes the row address RAD to select any of the word lines WL. The sense amplifier SA amplifies a difference in signal amount between data signals read to the bit line pair BL, /BL during the normal operation mode. The sense amplifier SA supplies one and the other of a high level voltage and a low level voltage to the bit line BL and the bit line /BL in response to the test control signals TESZ5-6 during the test mode. The dummy sense amplifier DSA supplies one and the other of the high level voltage and the low level voltage to the dummy bit line DBL and the dummy bit line /DBL in response to the test control signals TESZ5-6 during the test mode. The sense amplifier SA and the dummy sense amplifier operate in synchronization with the common sense amplifier activation signal LEZ.

The column switch CSW is selectively turned on in response to the column address CAD, and connects the bit lines BL, /BL corresponding to the column address CAD to the read amplifier RA and the write amplifier WA during the normal operation mode. The column switch CSW is always off during the test mode. The dummy column switch DCSW is always off regardless of the operation mode. The precharge circuit PRE and the dummy precharge circuit DPRE supply the precharge voltage VPR to the bit lines BL, /BL, DBL, /DBL during inactivation of the word lines WL and the sense amplifiers SA, DSA. The column decoder CDEC, the read amplifier RA, and the write amplifier WA have the same circuit configurations as those in the first embodiment.

Figure 18:
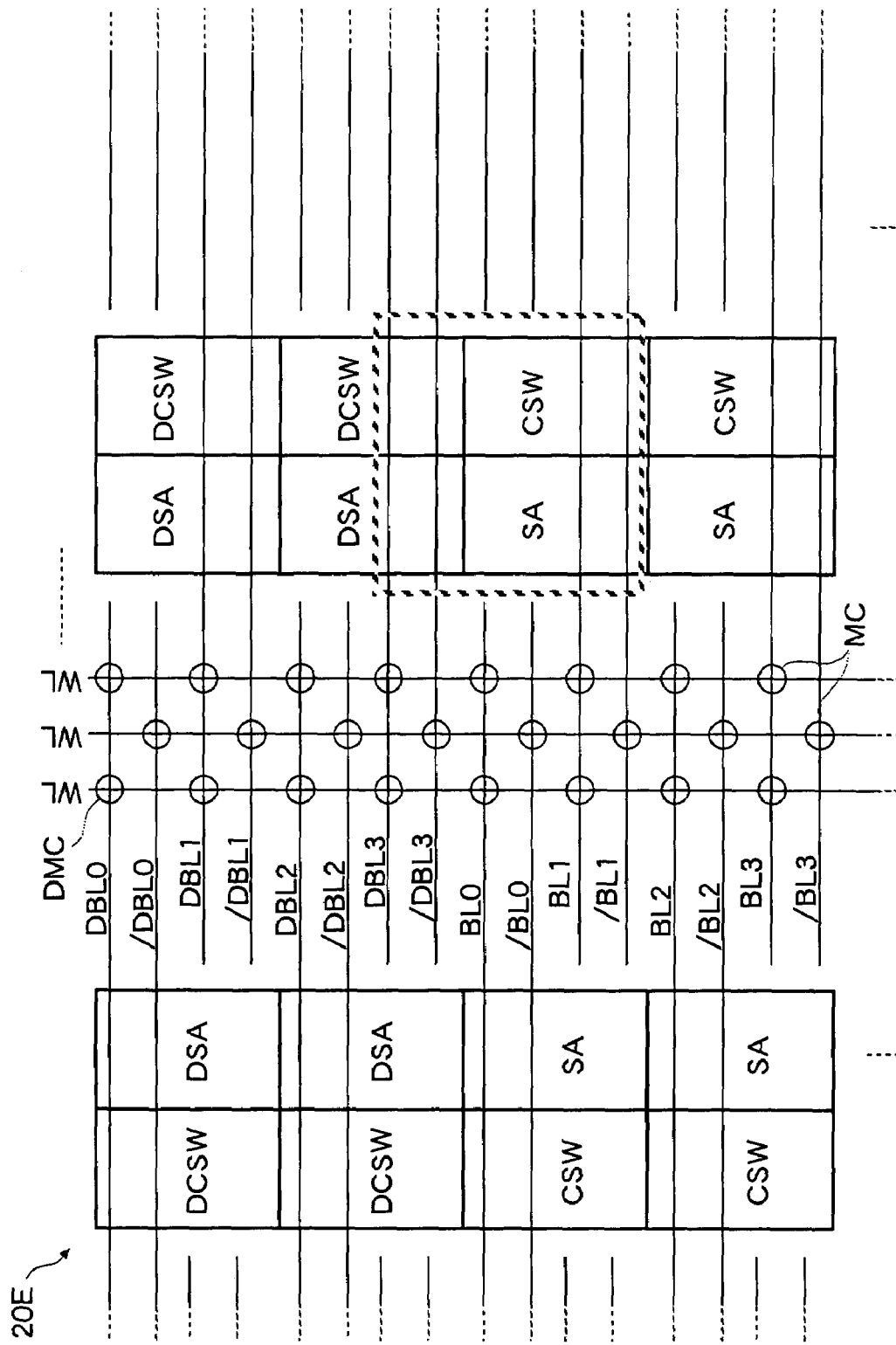
FIG. 18 is a block diagram showing an outline of a substantial part of a memory core shown in FIG. 17.

FIG. 18 shows an outline of a substantial part of the memory core 20E shown in FIG. 17. In this embodiment, for example, four dummy bit line pairs DBL, /DBL (DBL0-3, /DBL0-3) are wired. The sense amplifiers SA, DSA are shared between the bit line pairs BL, /BL, DBL, /DBL wired on both sides (a shared sense amplifier system). Wiring intervals of the bit line pairs BL, /BL, DBL, /DBL are all the same.

Figure 19:
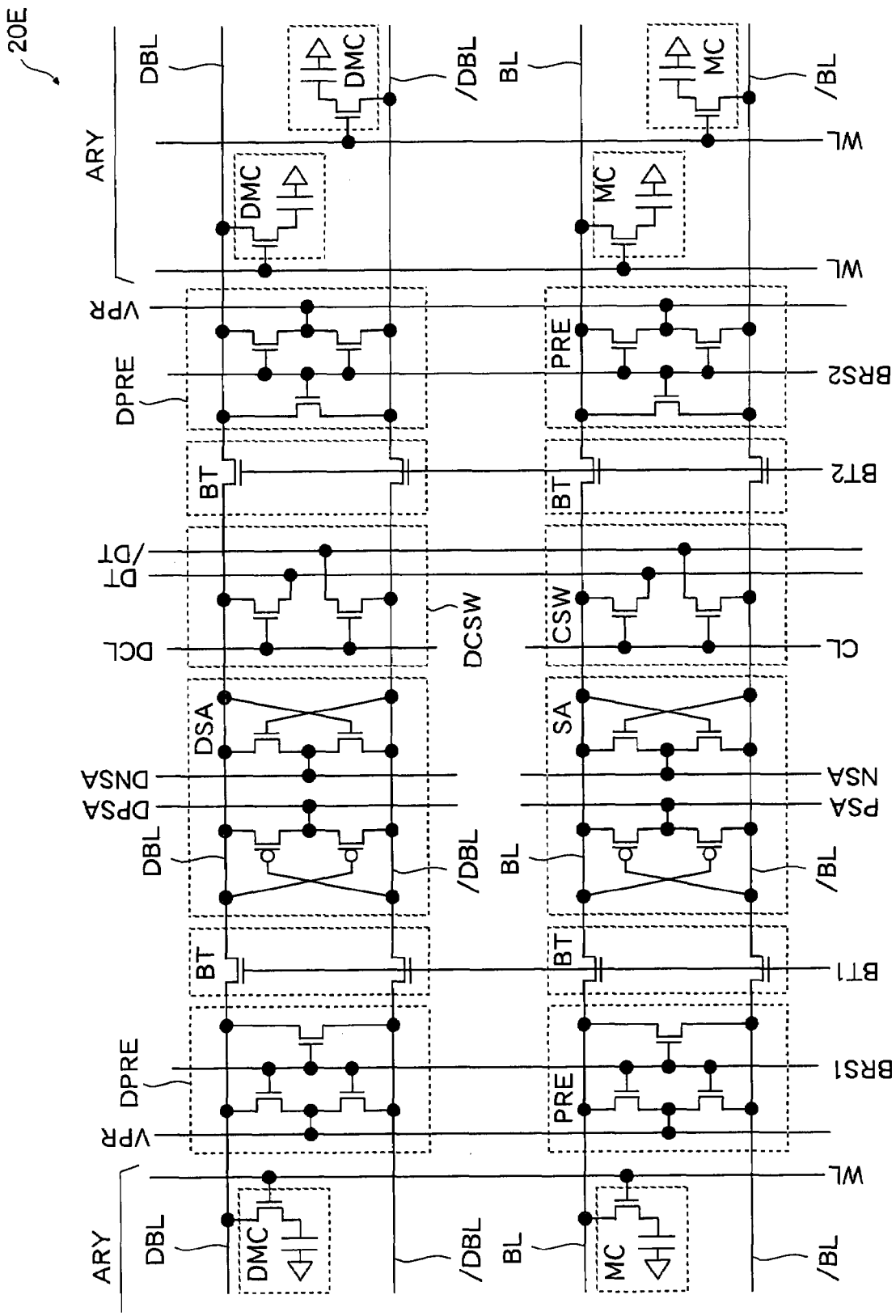
FIG. 19 is a circuit diagram showing details of a region shown by the heavy dotted line frame in FIG. 18.

FIG. 19 shows details of a region shown by the heavy dotted line frame in FIG. 18. The sense amplifiers SA, DSA, the column switches SCW, DSCW, and the precharge circuits PRE, DPRE are the same as those in FIG. 5 and have the same circuit configuration as each other. In this embodiment, the sense amplifier SA, DSA is shared between two bit line pairs BL, /BL (or DBL, /DBL) extending leftward/rightward of the figure, respectively. Therefore, the connection switch BT to selectively connect the sense amplifier SA, DSA to the bit line pair BL, /BL (or DBL, /DBL) is placed. While receiving the high logic level switch control signal BT1 (or BT2), the connection switch BT connects the bit line pairs BL, /BL and DBL, /DBL of its corresponding memory cell array ARY to the sense amplifiers SA and DSA.

The sense amplifier SA performs an amplification operation during activation of the sense amplifier activation signals PSA, NSA. The sense amplifier DSA performs an amplification operation during activation of sense amplifier activation signals DPSA, DNSA. The sense amplifier activation signals PSA, NSA and DPSA, DNSA are activated in synchronization with activation of the sense amplifier activation signal LEZ.

Figure 20:
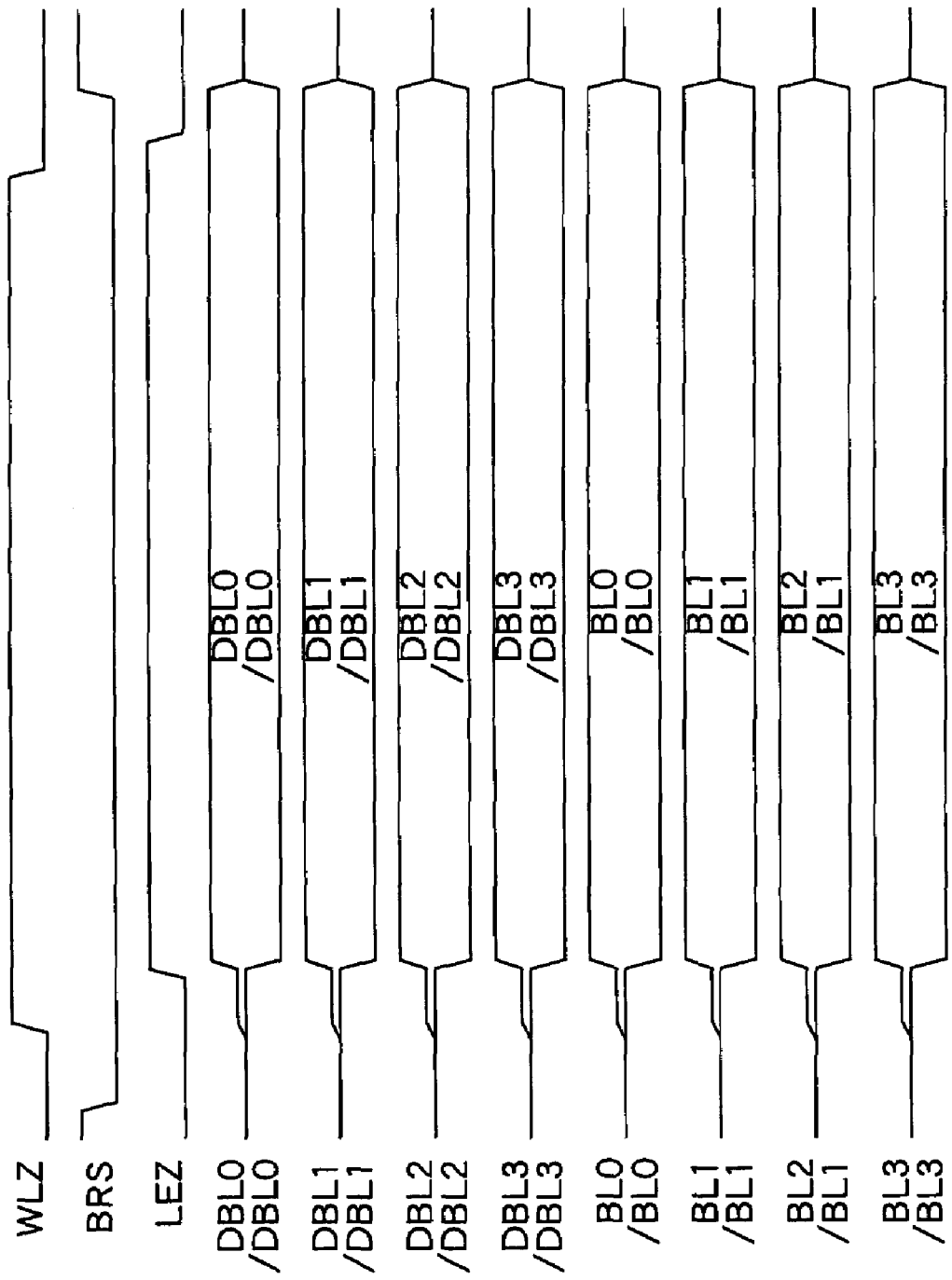
FIG. 20 is a timing chart showing an operation of a memory in a test mode of the sixth embodiment.

FIG. 20 shows an operation of the memory MEM in the test mode of the sixth embodiment. In this embodiment, by the setting of the test mode setting circuit 14E, the operation mode is shifted from the normal operation mode to the test mode, and only the test control signal TESZ5 is activated to a high logic level. The memory MEM performs a fifth stress test, for example, in response to the access command from the memory control unit MCNT shown in FIG. 6 or FIG. 7.

In response to the access command (write command, for example), the precharge control signal BRS is inactivated to a low logic level, and the word line WL is activated. The number of word lines WL to be activated may be one which corresponds to the row address RAD, or all of the word lines WL may be activated. Incidentally, when no stress is given to the memory cells MC and DMC, the word line WL may not be activated. In this case, by supplying the test mode command TMD to start/end the test to the core control circuit 12E, the sense amplifier activation signal LEZ is activated in synchronization with the test mode command TMD.

Thereafter, the sense amplifiers SA, DSA are activated at the same timing in synchronization with the sense amplifier activation signal LEZ. The real sense amplifier SA applies a high voltage level and a low voltage level to the bit lines BL (such as BL0-3) and /BL (such as /BL0-3), respectively. The dummy sense amplifier DSA applies the high voltage level and the low voltage level to the bit lines DBL (such as DBL0-3) and /DBL (such as /DBL0-3), respectively. Namely, the real sense amplifier SA functions as a real driver which applies a stress voltage to the real bit lines BL, /BL. The dummy sense amplifier DSA functions as a dummy driver which applies the stress voltage to the dummy bit lines DBL, /DBL. Consequently, the high voltage level and the low voltage level are alternately applied to the bit lines BL, /BL, DBL, /DBL, and hence stress tests on the bit lines BL, /BL, DBL, /DBL are performed.

Incidentally, to supply the high voltage level and the low voltage level to the bit lines BL, /BL, DBL, /DBL, the bit lines BL, DBL are temporarily connected to high voltage lines before the operations of the sense amplifiers SA, DSA are started. The bit lines /BL, /DBL are temporarily connected to low voltage lines before the operations of the sense amplifiers SA, DSA are started. Therefore, the memory core 20E has switches to selectively connect the bit lines BL, /BL, DBL, /DBL to either the high voltage line or the low voltage line.

A stress is applied between the real bit line BL0 located on the outermost side and the dummy bit line /DBL3 by the fifth stress test TEST5, so that a stress test on the real bit line BL0 can be certainly performed. In particular, the real sense amplifier SA and the dummy sense amplifier DSA have the same circuit configuration, and activation times of these sense amplifiers SA, DSA are determined by the common sense amplifier activation signal LEZ. Namely, the activation times of the sense amplifiers SA, DSA are equal to each other. Accordingly, as in the first embodiment, the same voltage stress can be applied to both the bit line BL wired on the inner side of the memory cell array ARY and the bit line BL wired on the outer side of the memory cell array ARY for the same length of time.

Incidentally, although not particularly shown, when only a test control signal TESZ6 is activated to the high logic level by the setting of the test mode setting circuit 14E, a sixth stress test TEST6 is performed. In the sixth stress test TEST6, contrary to FIG. 20, the real sense amplifier SA applies the low voltage level and the high voltage level to the bit lines BL and /BL, respectively. The dummy sense amplifier DSA applies the low voltage level and the high voltage level to the dummy bit lines DBL and /DBL, respectively. Namely, the high voltage level and the low voltage level are alternately applied to the bit lines BL, /BL, DBL, /DBL.

Figure 21:
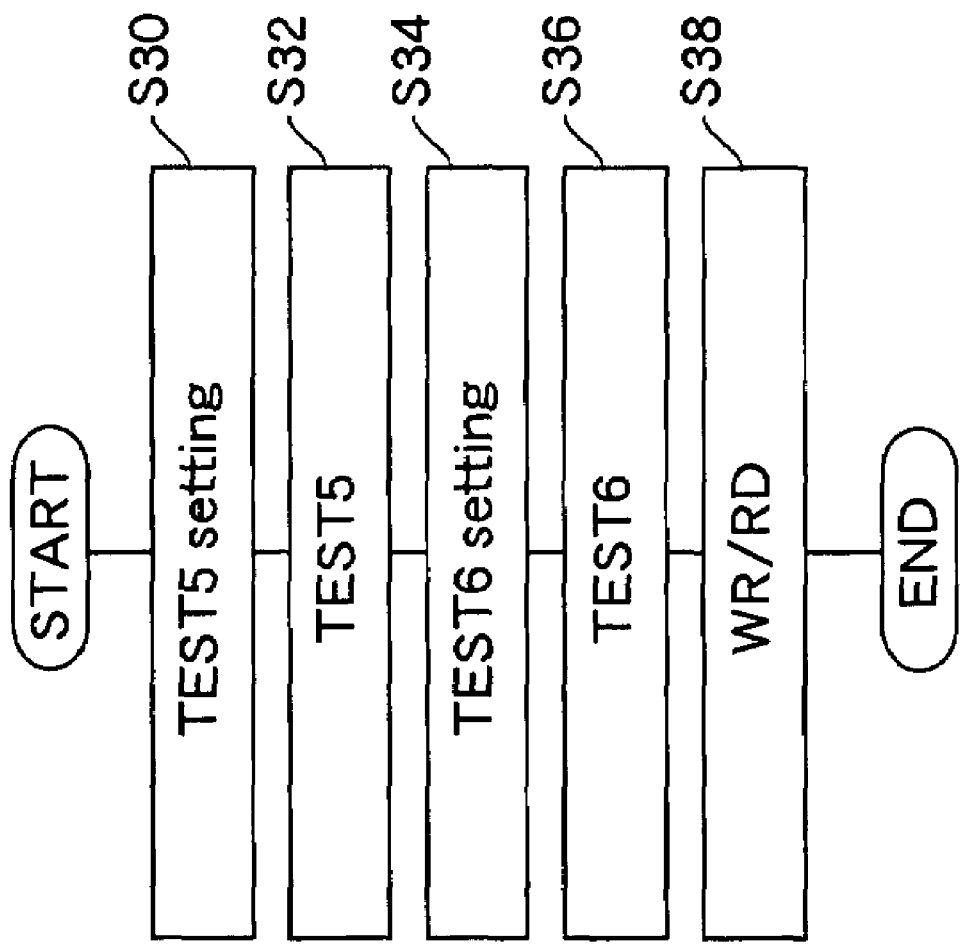
FIG. 21 is a flowchart showing a testing method of the sixth embodiment.

FIG. 21 shows a flow of a testing method of the sixth embodiment. This flow is performed, for example, by the controller CNT shown in FIG. 6 or the LSI tester LTST shown in FIG. 7. The test may be performed on the individual memory MEM in the chip state or the packaged state, or may be performed on the memory MEM in the wafer state.

First, in step S30, the test mode command TMD to perform the fifth stress test TEST5 is supplied to the test mode setting circuit 14E. By the setting of the test mode setting circuit 14E, the fifth stress test TEST5 shown in FIG. 20 is performed in step S32.

Then, in step S34, the test mode command TMD to perform the sixth stress test TEST6 is supplied to the test mode setting circuit 14E, and the sixth stress test TEST6 is performed in step S36. Subsequently, in step S38, as in step S22 in the first embodiment (FIG. 11), the write operation and the read operation are performed and the determination whether the memory MEM is a good product or a bad product is made.

As described above, also in the sixth embodiment, the same effect as in the above first embodiment can be obtained. In particular, stresses can be certainly applied to the bit lines BL, /BL.

Figure 22:
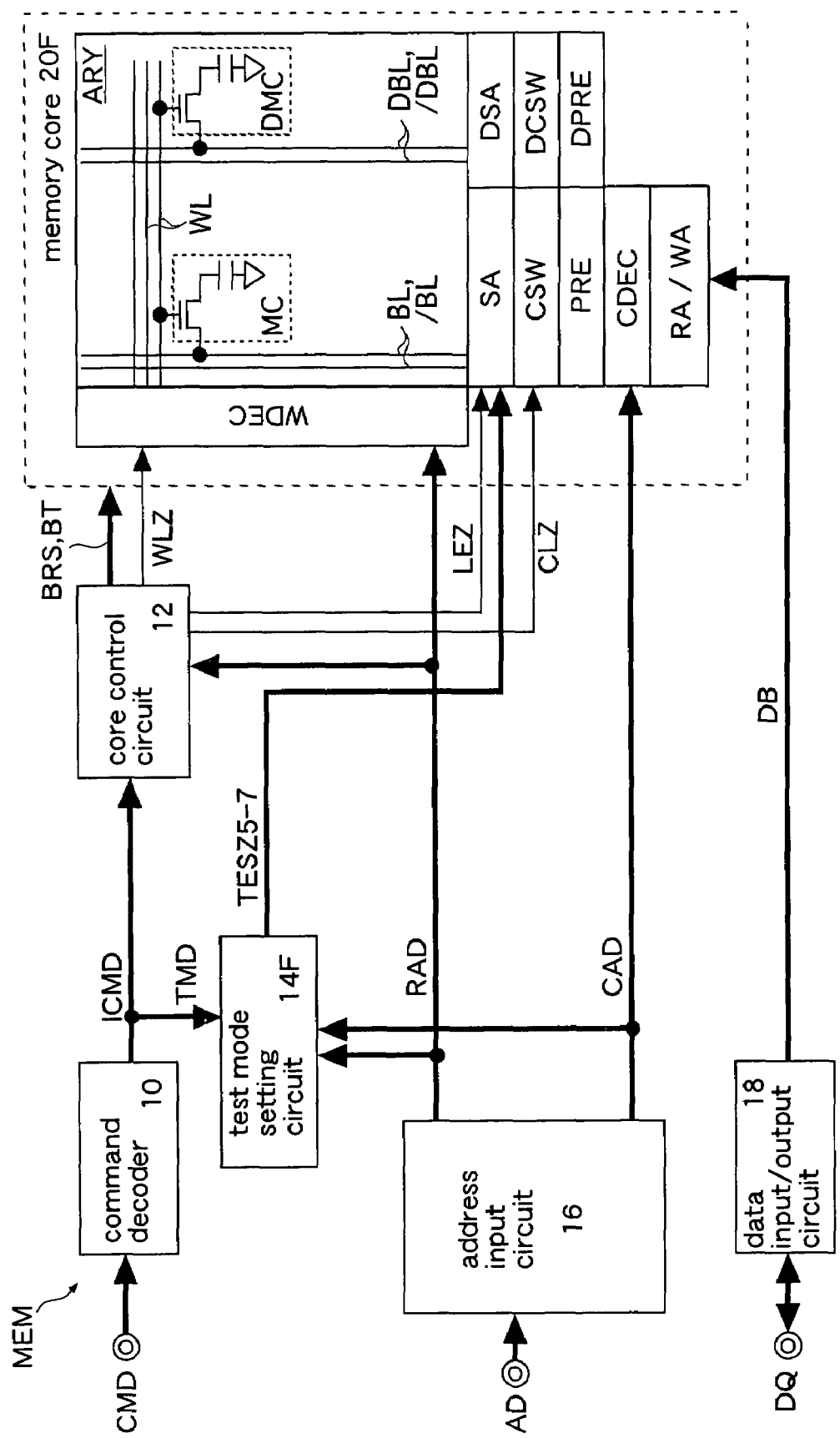
FIG. 22 is a block diagram showing a seventh embodiment of the present invention.

FIG. 22 shows a seventh embodiment of the present invention. The same symbols are used to designate the same elements as those described in the first and sixth embodiments, and a detailed description thereof is omitted. In this embodiment, a test mode setting circuit 14F and a memory core 20F are formed instead of the test mode setting circuit 14E and the memory core 20E of the sixth embodiment. The other constitutions are the same as in the first embodiment.

The test mode setting circuit 14F is constituted by adding a function of activating a test control signal TESZ7 in response to the address AD (RAD, CAD; second external signal) to the function of the test mode setting circuit 14E of the sixth embodiment. For example, when the column address CAD of "07" in hexadecimal is supplied with the test mode command TMD, the test mode setting circuit 14F activates the test control signal TESZ7. A seventh stress test is performed by the activation of the test control signal TESZ7. The seventh stress test is a test in which the dummy bit line pair DBL, /DBL is selected instead of the real bit line pair BL, /BL selected by the column address CAD and data is inputted/outputted to/from the dummy memory cell DMC.

Incidentally, the stress tests TEST5-6 performed by the activation of the test control signals TESZ5-6 are the same as in the sixth embodiment. The memory core 20F is the same as the memory core 20C of the sixth embodiment except that the constitution of the column decoder CDED differs from that of the sixth embodiment.

Figure 23:
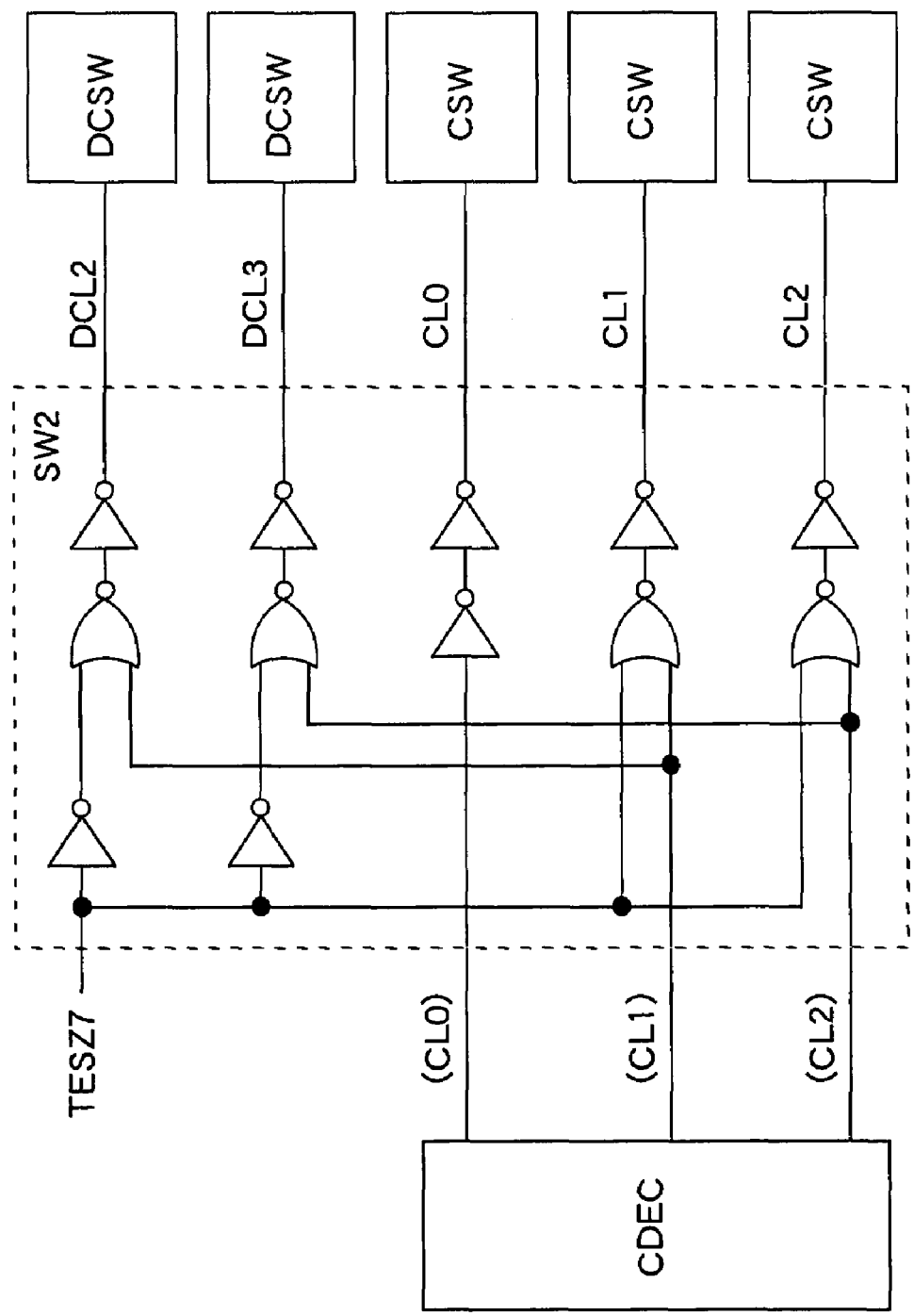
FIG. 23 is a circuit diagram showing a substantial part of a column decoder shown in FIG. 22.

FIG. 23 shows a substantial part of the column decoder CDEC shown in FIG. 22. The column decoder CDEC is constituted by placing a switch circuit SW2 at outputs of the column decoder CDEC connected to the column selection lines CL0-2. The other constitutions are the same as those of the column decoder CDEC of the first embodiment.

The switch circuit SW2 outputs column selection signals CL0-2 outputted from the column decoder CDEC to the column switches CSW during inactivation of the test control signal TESZ7 (during the normal operation mode or during the stress tests TEST5-6). The switch circuit SW2 outputs the column selection signals CL1-2 outputted from the column decoder CDEC as the dummy column selection signals DCL2-3 to the dummy column switches DCSW during the activation of the test control signal TESZ7 (during a stress test TEST7). The dummy column selection signals DCL2-3 are supplied to the dummy column switches DCSW corresponding to the dummy bit line pairs DBL2, /DBL2 and DBL3, /DBL3, respectively. Drivabilities of final-stage buffers (inverters) are all the same.

In this embodiment, the seventh stress test TEST7 is performed during the test mode in which the test mode setting circuit 14F activates the test control signal TESZ7. When the column address CAD (first address) to select the column selection line CL1 or CL2 is supplied during the seventh stress test TEST7, the dummy column selection signals DCL0-1 are activated, respectively, instead of the column selection signals CL1-2. On the other hand, when the column address CAD other than the first address is supplied during the seventh stress test TEST7, the column selection line CL other than the column selection lines CL1-2 is activated. As described above, the column decoder CDEC drives the real bit line pair BL, /BL or the dummy bit line pair DBL, /DBL in response to the column addresses CAD from the memory control unit MCNT shown in FIG. 6 or FIG. 7.

When the first address is supplied during the seventh stress test TEST7, either of the dummy column selection lines DCL2-3 is selectively activated in response to the column address CAD. Then, data is inputted/outputted to/from the dummy memory cell DMC connected to the dummy bit lines DBL2, /DBL2 or DBL3, /DBL3 according to the row address RAD. Namely, the switch circuit SW2 and the column switches CSW, DCSW function as a data control circuit which releases a connection between the data input/output circuit 18 and the real memory cell MC and connects the data input/output circuit 18 to the dummy memory cell DMC.

The seventh stress test makes it possible to input/output data to/from the dummy memory cell DMC connected to the dummy bit line pair DBL3, /DBL3 adjacent to the real bit line pair BL0, /BL0 wired on the outermost side of the memory cell array ARY. By writing data to the dummy memory cell DMC by the seventh stress test TEST7 before the fifth or sixth stress test TEST5-6, a stress test on the real bit line pair BL0, /BL0 can be performed while data with a desired value is held in the adjacent dummy memory cell DMC. Further, by reading data from the dummy memory cell DMC by the seventh stress test TEST7 after the fifth or sixth stress test TEST5-6, the influence of the fifth or sixth stress test TEST5-6 on the dummy memory cell DMC can be evaluated.

As described above, also in the seventh embodiment, the same effects as in the above first, second, and sixth embodiments can be obtained. Further, in this embodiment, data can be written/read to/from the dummy memory cell DMC adjacent to the real bit line pair BL0, /BL0 wired on the outermost side of the memory cell array ARY, so that a detailed stress test can be performed.

Figure 24:
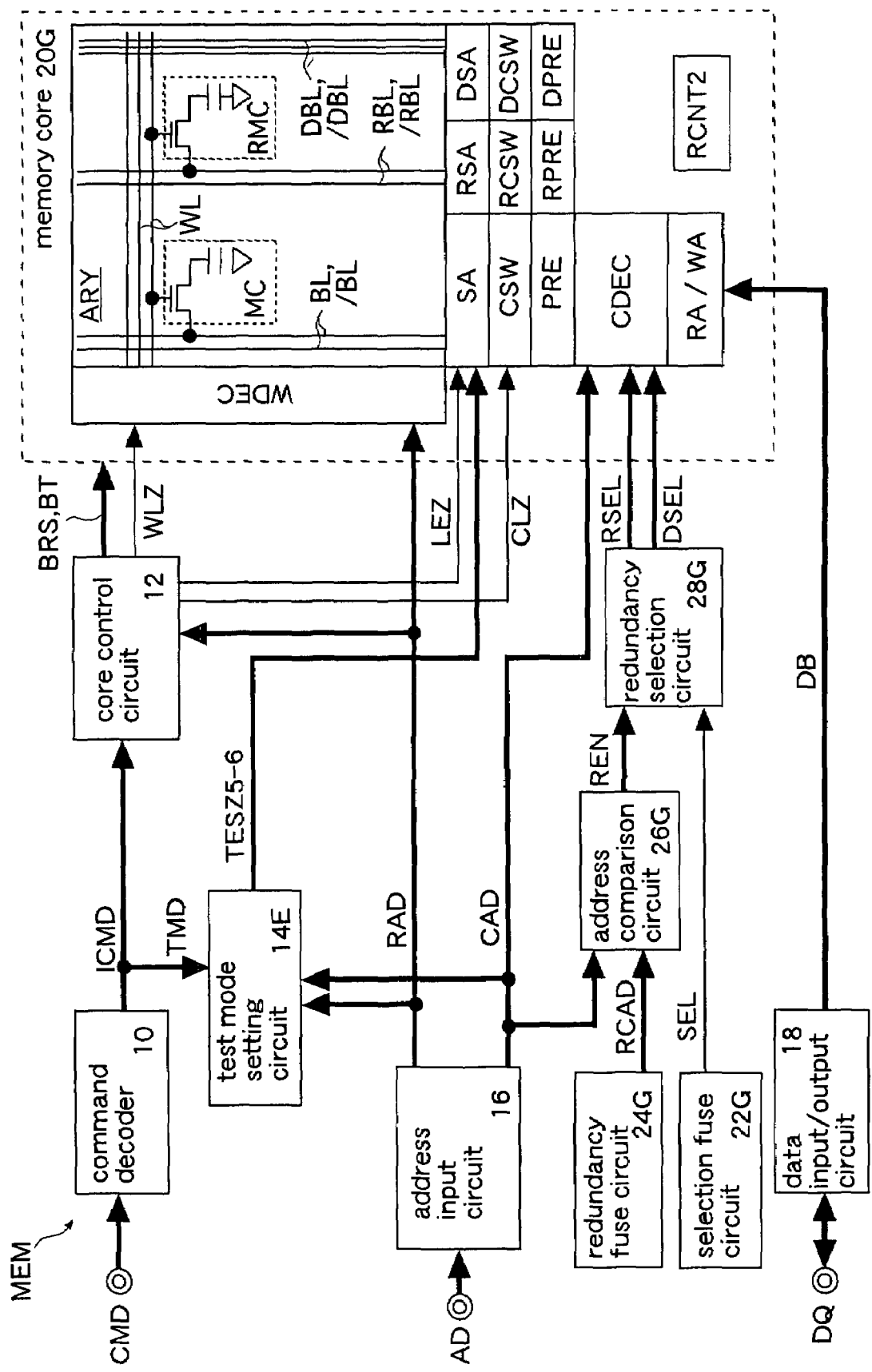
FIG. 24 is a block diagram showing an eighth embodiment of the present invention.

FIG. 24 shows an eighth embodiment of the present invention. The same symbols are used to designate the same elements as those described in the first and sixth embodiments, and a detailed description thereof is omitted. In this embodiment, a memory core 20G is formed instead of the memory core 20E of the sixth embodiment. Further, a selection fuse circuit 22G, a redundancy fuse circuit 24G, an address comparison circuit 26G, and a redundancy selection circuit 28G are newly formed. The other constitutions are the same as in the sixth embodiment. Incidentally, it is also possible to replace the memory core 20F of the seventh embodiment with the memory core 20G and further newly form the selection fuse circuit 22G, the redundancy fuse circuit 24G, the address comparison circuit 26G, and the redundancy selection circuit 28G.

The memory core 20G is constituted by adding a redundancy control circuit RCNT2, a redundancy sense amplifier RSA, a redundancy column switch RCSW, a redundancy precharge circuit RPRE, redundancy memory cells RMC, and a redundancy bit line pair RBL, /RBL connected to the redundancy memory cells RMC.

The redundancy fuse circuit 24G (first redundancy memory circuit) includes a fuse which stores a redundancy column address RCAD (defect address) indicating the real bit line pair BL, /BL having a failure. The redundancy fuse circuit 24G outputs the redundancy column address RCAD according to a programmed state of the fuse. The selection fuse circuit 22G (second redundancy memory circuit) includes a fuse which stores defect information indicating that a failure exists in the redundancy bit line pair RBL, /RBL or the redundancy memory cell RMC. The selection fuse circuit 22G outputs the selection signal SEL according to a programmed state of the fuse. The selection fuse circuit 22G inactivates the selection signal SEL when the fuse is not programmed, and activates the selection signal SEL when the fuse is programmed. The inactivated selection signal SEL indicates that the redundancy bit line pair RBL, /RBL is used when the failure is relieved. The activated selection signal SEL indicates that the dummy bit line pair DBL, /DBL is used when the failure is relieved.

The address comparison circuit 26G outputs the redundancy enable signal REN when the column address CAD and the redundancy column address RCAD match. When the redundancy enable signal REN is activated, the redundancy selection circuit 28G outputs the redundancy selection signal RSEL or the dummy selection signal DSEL in response to the selection signal SEL.

The redundancy control circuit RCNT2 disables driving (data input/output) of the real bit line pair BL, /BL corresponding to the defect address stored in the redundancy fuse circuit 24G and instead enables driving (data input/output) of the redundancy bit line pair RBL, /RBL. Further, the redundancy control circuit RCNT2 enables driving of the dummy bit line pair DBL, /DBL instead of the redundancy bit line pair RBL, /RBL when the defect information indicating the failure in the redundancy bit line pair RBL, /RBL is stored in the redundancy fuse circuit 22G. Namely, the memory core 20G selects the redundancy bit line pair RBL, /RBL instead of the real bit line pair B, /BL when receiving the redundancy selection signal RSEL and selects the dummy bit line pair DBL, /DBL instead of the redundancy bit line pair RBL, /RBL when receiving the dummy selection signal RSEL.

The bit line pairs BL, /BL, RBL, /RBL, DBL, /DBL are selected by switching the column selection signal CL, the redundancy column selection signal RCL, and the dummy column selection signal DCL to turn on the column switches CSW, RCSW, DSCW to each other. The redundancy memory cell RMC has the same shape and characteristic as the real memory cell MC as in the third embodiment.

In this embodiment, when a failure exists in the real bit line pair BL, /BL or the real memory cell MC, the failure is relieved by using the redundancy bit line pair RBL, /RBL. Further, when a failure exists in the redundancy bit line pair RBL, /RBL or the redundancy memory cell RMC, the failure is relieved by using the dummy bit line pair DBL, /DBL. A stress evaluation on the dummy bit line pair DBL, /DBL is performed by the stress tests TEST5-6 described in the sixth embodiment under the same condition as that of the real bit line pair BL, /BL. Therefore, the dummy bit line pair DBL, /DBL can be used instead of the real bit line pair BL, /BL. Namely, the dummy bit line pair DBL, /DBL can be used instead of the redundancy bit line pair RBL, /RBL to relieve the failure.

Incidentally, when plural redundancy bit line pairs RBL, /RBL are formed, plural selection signals SEL corresponding to the respective redundancy bit line pairs RBL, /RBL may be outputted from the selection fuse circuit 22G. Thereby, plural dummy bit line pairs DBL, /DBL can be used instead of the plural redundancy bit line pairs RBL, /RBL. This goes for a ninth and tenth embodiments described later.

As described above, also in the eighth embodiment, the same effects as in the above first and sixth embodiments can be obtained. Further, in this embodiment, when a failure exists in the redundancy bit line pair RBL, /RBL or the redundancy memory cell RMC, the failure can be relieved using the dummy bit line pair DBL, /DBL. Consequently, the yield of the memory MEM can be improved.

Figure 25:
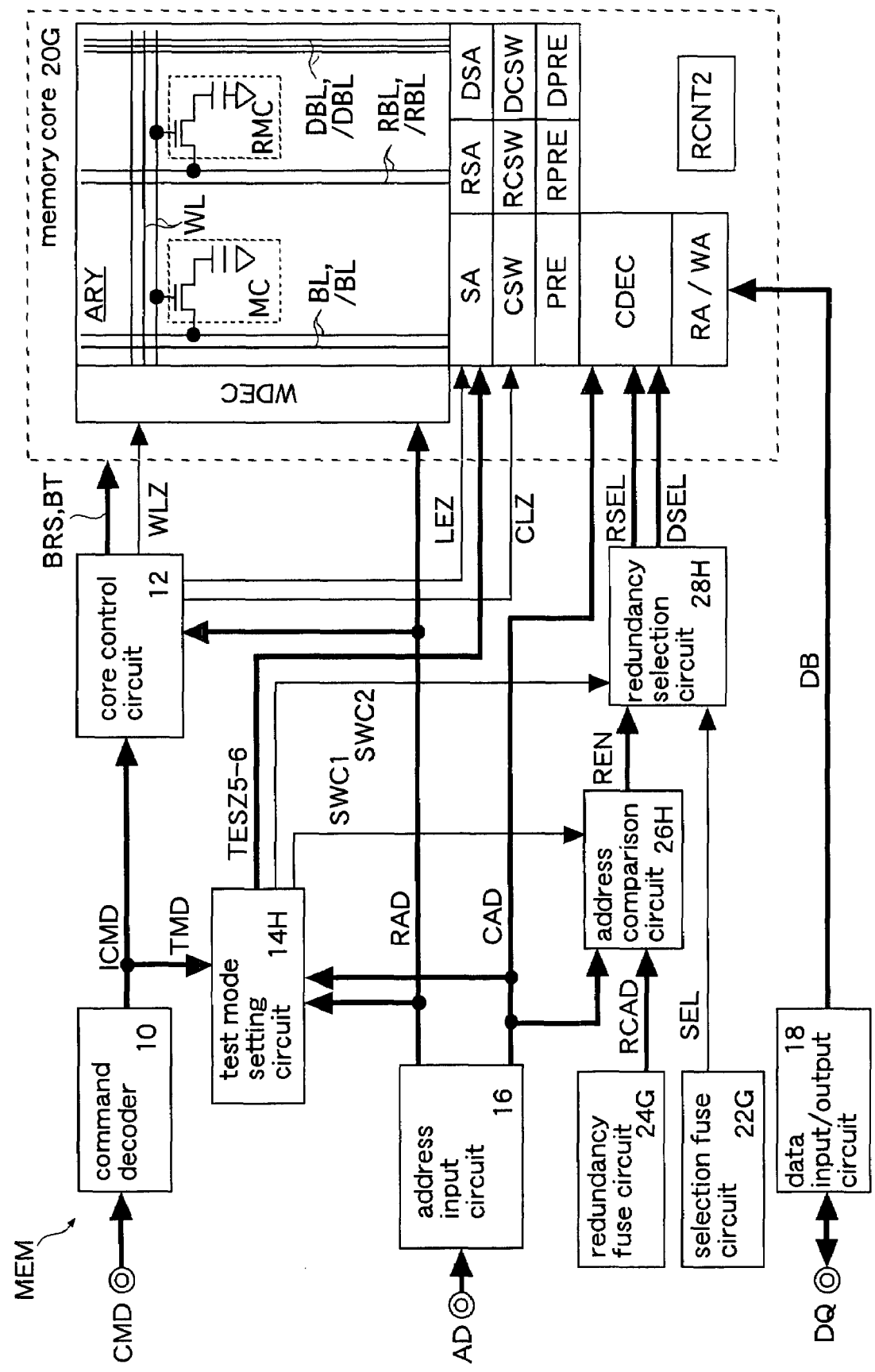
FIG. 25 is a block diagram showing a ninth embodiment of the present invention.

FIG. 25 shows a ninth embodiment of the present invention. The same symbols are used to designate the same elements as those described in the first, sixth, and eighth embodiments, and a detailed description thereof is omitted. In this embodiment, a test mode setting circuit 14H, an address comparison circuit 26H, and a redundancy selection circuit 28H are formed instead of the test mode setting circuit 14E, the address comparison circuit 26G, and the redundancy selection circuit 28G of the eighth embodiment. The other constitutions are the same as in the eighth embodiment.

The test mode setting circuit 14H is constituted by adding a function of activating the switch control signals SWC1, SWC2 in response to the address AD (RAD, CAD: second external signal) to the function of the test mode setting circuit 14E of the sixth embodiment. The address comparison circuit 26H forcibly outputs the redundancy enable signal REN regardless of the comparison result between the column addresses CAD, RCAD when receiving the activation of the switch control signal SWC1. The redundancy selection circuit 28H forcibly outputs the dummy selection signal DSEL regardless of the selection signal SEL when receiving the activation of the switch control signal SWC2. Thereby, before the fuse circuits 22G, 24G are programmed, the real bit line pair BL, /BL can be replaced with the redundancy bit line pair RBL, /RBL or the dummy bit line DBL, /DBL by the setting of the test mode setting circuit 14H.

As described above, also in the ninth embodiment, the same effects as in the above first, third, sixth, and eighth embodiments can be obtained. Further, in this embodiment, the real bit line pair BL, /BL can be replaced with the redundancy bit line pair RBL, /RBL or the dummy bit line pair DBL, /DBL before the fuse circuits 22G, 24G are programmed, so that operations of the bit line pairs RBL, /RBL, DBL, /DBL and the memory cells RMC, DMC, can be previously confirmed before the fuse circuits 22G, 24G are programmed.

Figure 26:
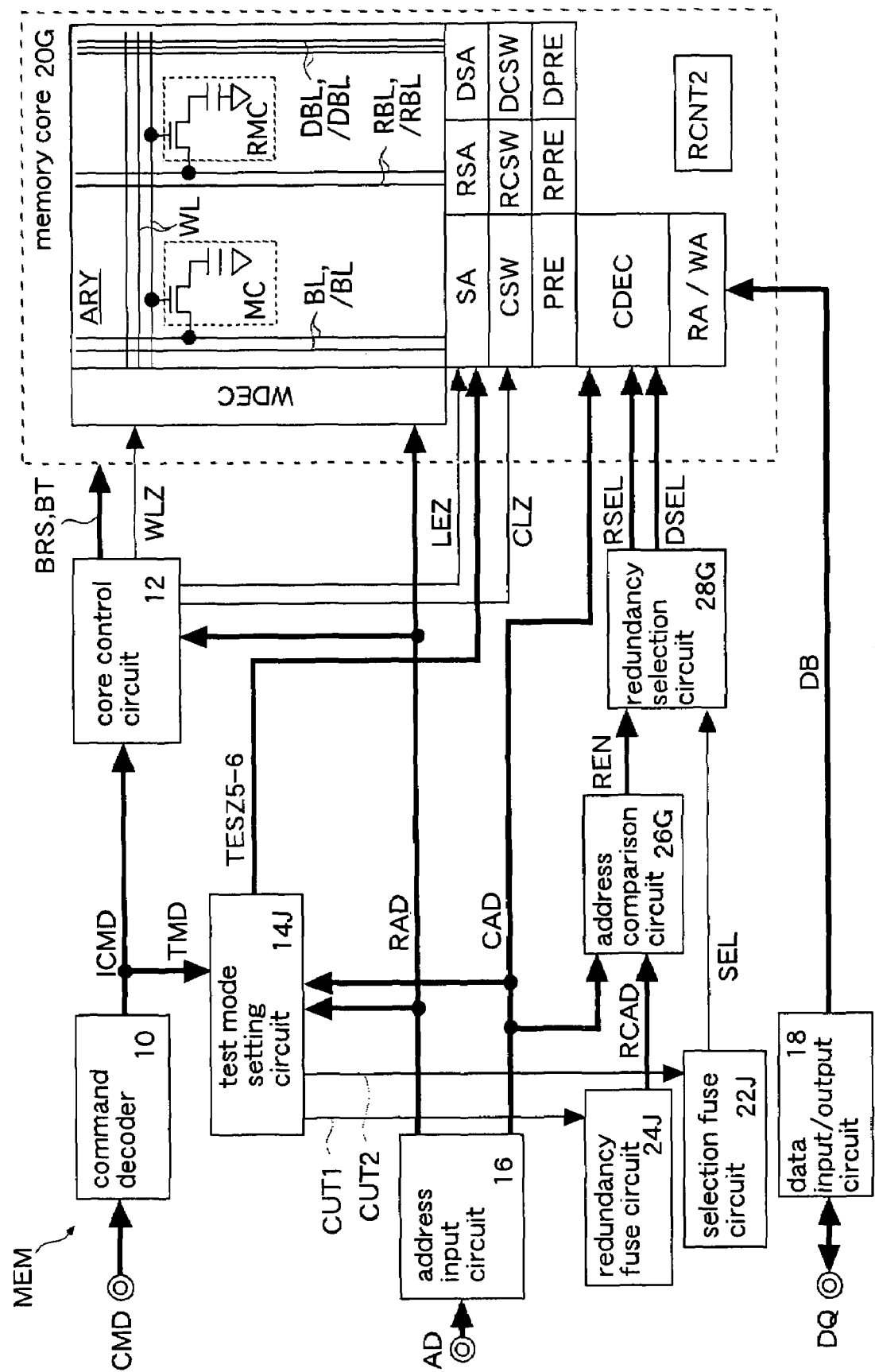
FIG. 26 is a block diagram showing a tenth embodiment of the present invention.

FIG. 26 shows a tenth embodiment of the present invention. The same symbols are used to designate the same elements as those described in the first, sixth, and eighth embodiments, and a detailed description thereof is omitted. In this embodiment, a test mode setting circuit 14J, a selection fuse circuit 22J, and a redundancy fuse circuit 24J are formed instead of the test mode setting circuit 14E, the selection fuse circuit 22G, and the redundancy fuse circuit 24G of the eighth embodiment. The other constitutions are the same as in the eighth embodiment.

The test mode setting circuit 14J is constituted by adding a function of activating the cut control signals CUT1, CUT2 in response to the address AD (RAD, CAD: second external signal) to the function of the test mode setting circuit 14E of the eighth embodiment. The redundancy fuse circuit 24J forcibly outputs the predetermined redundancy column address RCAD regardless of a programmed state of a fuse when receiving the activation of the cut control signal CUT1. The selection fuse circuit 22J forcibly activates the selection signal SEL regardless of a programmed state of a fuse when receiving the activation of the cut control signal CUT2. Thereby, before the fuse circuits 22J, 24J are programmed, the real bit line pair BL, /BL can be replaced with the redundancy bit line pair RBL, /RBL or the dummy bit line pair DBL, /DBL by the setting of the test mode setting circuit 14J.

As described above, also in the tenth embodiment, the same effects as in the above first, third, sixth, and eighth embodiments can be obtained.

Incidentally, in the above embodiments, the example in which the present invention is applied to the pseudo SRAM (FCRAM) is described. The present invention is not limited to these embodiments. For example, the present invention may be applied to a DRAM or an SDRAM. Alternatively, the present invention may be applied to an SRAM or a nonvolatile semiconductor memory.

In the above embodiments, the example in which the present invention is applied to the memory MEM in the wafer state, the chip state, or the packaged state, or the system SYS on which the memory MEM is mounted is described. The present invention is not limited to these embodiments. For example, the present invention may be applied to a system LSI on which a macro of the memory MEM is mounted, a CPU containing the memory MEM, or the like.

Further, by combining the first and sixth embodiments, the present invention may be applied to a semiconductor memory including the dummy word lines DWL and the dummy bit line pairs DBL, /DBL. Similarly, by combining the second and seventh embodiment, the fourth and seventh stress tests may be performable. By combining the third and eighth embodiments, the present invention may be applied to a semiconductor memory including the redundancy word line RWL and the redundancy bit line pair RBL, /RBL. The second, third, seventh, and eighth embodiments may be combined.

Furthermore, the memory core of the shared sense amplifier system of the sixth embodiment may be adopted in the first to fifth embodiments. The memory core of the non-shared sense amplifier system of the first embodiment may be adopted in the sixth to tenth embodiments.

In the above embodiments, the example in which plural dummy signal lines DWL and plural dummy signal line pairs DBL, /DBL are formed is described. The present invention is not limited to these embodiments. For example, only one dummy signal line DWL and one dummy signal line pair DBL, /DBL may be formed.

Figure 27:
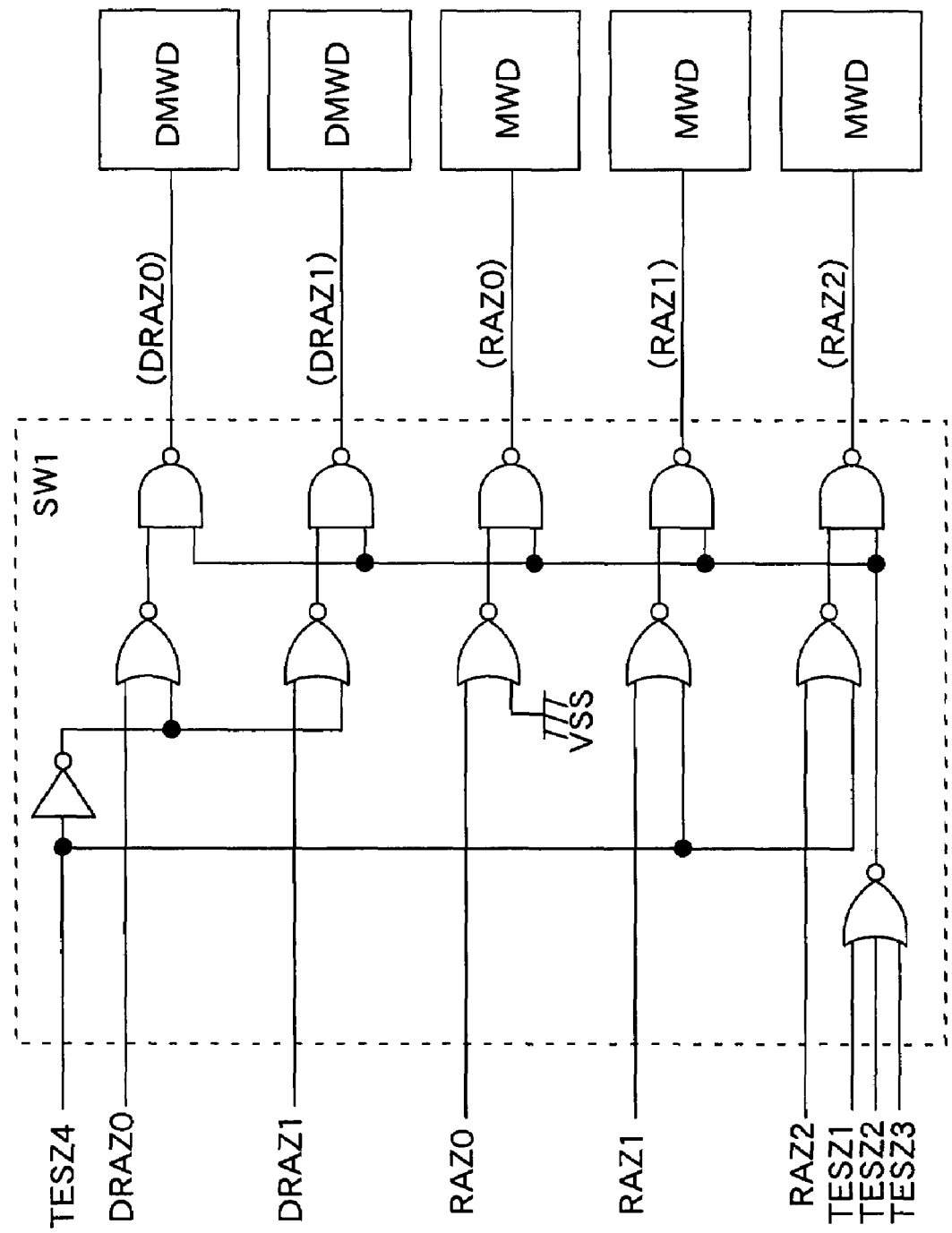
FIG. 27 is a circuit diagram showing a modified example of the second embodiment.

In the above second embodiment (FIG. 13), the example in which the switch circuit SW1 is placed between the main word decoders MWD and the sub-word decoders SWD is described. The present invention is not limited to this embodiment. For example, as shown in FIG. 27, the switch circuit SW1 may be placed on the input sides of the main word decoders MWD and the dummy main word decoders DMWD. In this case, the logic of the test control signal TESZ4 is incorporated before the logic of the test control signals TESZ1-3. Consequently, during the stress tests TEST1-3, the main word decoders MWD, DMWD can be operated in perfect synchronization with each other. Incidentally, the dummy word line DWL can be used as a redundancy word line by eliminating the test control signal TESZ4 and replacing a two-input NOR gate with an inverter.

Figure 28:
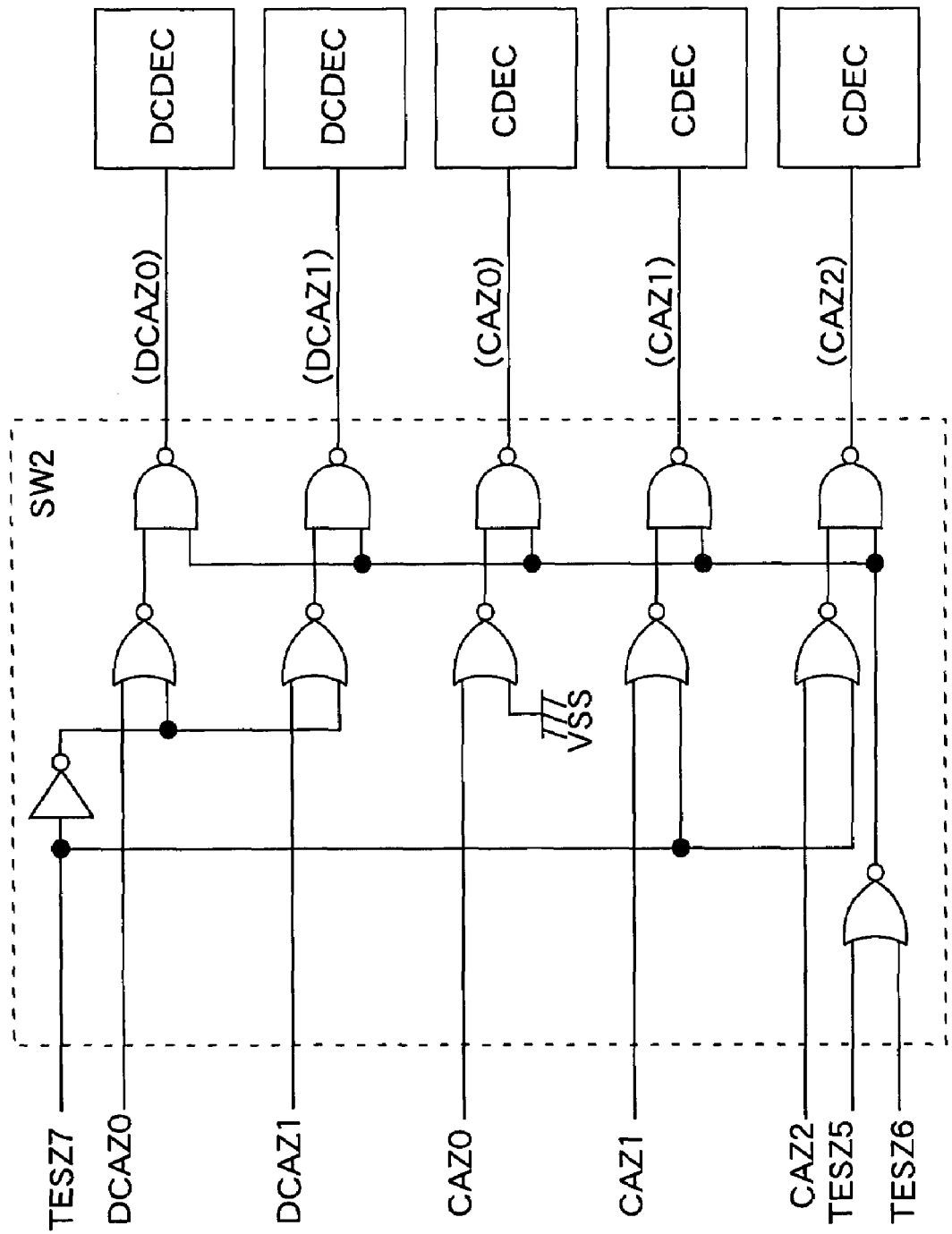
FIG. 28 is a circuit diagram showing a modified example of the seventh embodiment.

In the above seventh embodiment (FIG. 23), the example in which the switch circuit SW2 is placed on the input sides of the column switches CSW, DCSW is described. The present invention is not limited to this embodiment. For example, as shown in FIG. 28, the switch circuit SW2 may be placed on the input sides of the real column decoders CDEC and the dummy column decoders DCEDC. The dummy column decoder DCDEC outputs the dummy column selection signal DCL. In FIG. 28, the logic of the test control signal TESZ7 is incorporated before the logic of the test control signals TESZ5-6. Consequently, during the stress tests TEST5-6, the column decoders CDEC, DCDEC can be operated in perfect synchronization with each other. Incidentally, the dummy bit line pair DBL, /DBL can be used as a redundancy bit line pair by eliminating the test control signal TESZ7 and replacing a two-input NOR gate with an inverter.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor memory, comprising:
    real memory cells and dummy memory cells;
    at least one real signal line connected to said real memory cells;
    at least one dummy signal line placed outside said real signal line and connected to said dummy memory cells;
    a real driver driving said real signal line in synchronization with a common timing signal;
    a dummy driver driving said dummy signal line in synchronization with said common timing signal; and
    an operation control circuit generating the common timing signal to be supplied to said real driver and said dummy driver,
    wherein the at least one real signal line and the at least one dummy signal line are activated in synchronization with said common timing signal in a test mode.

2. The semiconductor memory according to claim 1, further comprising
    a test mode setting circuit shifting an operation mode from a normal operation mode to said test mode in response to a first external signal,
    wherein said dummy driver operates to drive said dummy signal line during said test mode.

3. The semiconductor memory according to claim 1, wherein
    said dummy memory cell has a same shape and characteristic as said real memory cell, and said dummy driver is constituted of a same circuit as said real driver.

4. The semiconductor memory according to claim 1, further comprising:
    redundancy memory cells each having a same shape and characteristic as said real memory cell;
    a redundancy signal line connected to said redundancy memory cells;
    a first redundancy memory circuit storing a defect address;
    a second redundancy memory circuit storing defect information indicating that said redundancy signal line or said redundancy memory cell is a failure; and
    a redundancy control circuit disabling driving of the real signal line corresponding to said defect address stored in said first redundancy memory circuit and enabling driving of said redundancy signal line, and moreover, when said defect information is stored in said second redundancy circuit, enabling driving of said dummy signal line instead of said redundancy signal line.

5. The semiconductor memory according to claim 1, wherein said real signal line and said dummy signal line are a real word line and a dummy word line, and said real driver and said dummy driver are a real word driver and a dummy word driver.

6. The semiconductor memory according to claim 1, wherein said real signal line and said dummy signal line are a real bit line and a dummy bit line, and said real driver and said dummy driver are a real sense amplifier and a dummy sense amplifier.

7. The semiconductor memory according to claim 2, wherein said test mode setting circuit outputs a test control signal in response to a second external signal, and said real driver and said dummy driver drive said real signal line and said dummy signal line in response to said test control signal during said test mode.

8. The semiconductor memory according to claim 7, wherein said real driver and said dummy driver drive all of said real signal lines and said dummy signal lines in response to said test control signal.

9. The semiconductor memory according to claim 7, wherein said real driver and said dummy driver drive said real signal lines and said dummy signal lines on every other line in response to said test control signal.

10. The semiconductor memory according to claim 7, wherein said real driver and said dummy driver drive only one of said real signal lines or said dummy signal lines in response to said test control signal.

11. The semiconductor memory according to claim 10, further comprising
a decoding circuit decoding an address to select said real signal line, wherein
said decode circuit has a switch circuit which, when a first address is supplied during said test mode, selects said dummy signal line instead of said real signal line corresponding to said first address.

12. The semiconductor memory according to claim 10, further comprising:
a data input/output circuit inputting/outputting data to/from said real memory cell during said normal operation mode; and
a data control circuit releasing a connection between said data input/output circuit and said real memory cell and instead connecting said dada input/output circuit to said dummy memory cell during said test mode.

13. The semiconductor memory according to claim 4, wherein said first and second redundancy memory circuits have fuses storing said defect address and said defect information.

14. A system comprising a semiconductor memory and a controller controlling access to said semiconductor memory, wherein said semiconductor memory comprises:
real memory cells and dummy memory cells;
at least one real signal line connected to said real memory cells;
at least one dummy signal line placed outside said real signal line and connected to said dummy memory cells;
a real driver driving said real signal line in synchronization with a common timing signal;
a dummy driver driving said dummy signal line in synchronization with said common timing signal; and
an operation control circuit generating the common timing signal to be supplied to said real driver and said dummy driver,
wherein the at least one real signal line and the at least one dummy signal line are activated in synchronization with said common timing signal in a test mode.

15. The system according to claim 14, wherein
said semiconductor memory comprises a test mode setting circuit shifting an operation mode from a normal operation mode to said test mode in response to a first external signal,
said dummy driver operates to drive said dummy signal line during said test mode, and
said controller comprises a test control circuit outputting said first external signal to shift said semiconductor memory from said normal operation mode to said test mode.

16. The system according to claim 14, wherein said semiconductor memory comprises:
redundancy memory cells each having a same shape and characteristic as said real memory cell;
a redundancy signal line connected to said redundancy memory cells;
a first redundancy memory circuit storing a defect address;
a second redundancy memory circuit storing defect information indicating that said redundancy signal line or said redundancy memory cell is a failure; and
a redundancy control circuit disabling driving of the real signal line corresponding to said defect address stored in said first redundancy memory circuit and enabling driving of said redundancy signal line, and moreover, when said defect information is stored in said second redundancy circuit, enabling driving of said dummy signal line instead of said redundancy signal line.

17. The system according to claim 15, wherein:
said test mode setting circuit outputs a test control signal in response to a second external signal;
said real driver and said dummy driver drive said real signal line and said dummy signal line in response to said test control signal during said test mode; and
said test control circuit outputs said second external signal to drive said real signal line and said dummy signal line.

* * * * *